(12) United States Patent
Rantala et al.

(10) Patent No.: US 11,289,666 B2
(45) Date of Patent: Mar. 29, 2022

(54) ELECTRICALLY CONDUCTIVE SILOXANE PARTICLE FILMS, AND DEVICES WITH THE SAME

(71) Applicant: Inkron Oy, Espoo (FI)

(72) Inventors: Juha Rantala, Espoo (FI); Jarkko Heikkinen, Espoo (FI); Janne Kylmä, Espoo (FI)

(73) Assignee: Inkron Oy, Espoo (FI)

( * ) Notice: Subject to any disclaimer, the term of this patent is extended or adjusted under 35 U.S.C. 154(b) by 14 days.

(21) Appl. No.: 15/766,846

(22) PCT Filed: Oct. 10, 2016

(86) PCT No.: PCT/FI2016/050708
§ 371 (c)(1),
(2) Date: Apr. 9, 2018

(87) PCT Pub. No.: WO2017/060572
PCT Pub. Date: Apr. 13, 2017

(65) Prior Publication Data
US 2018/0301648 A1 Oct. 18, 2018

(30) Foreign Application Priority Data
Oct. 9, 2015 (FI) ..................................... 20155713

(51) Int. Cl.
*H01L 51/00* (2006.01)
*H01L 51/44* (2006.01)
(Continued)

(52) U.S. Cl.
CPC ............ *H01L 51/442* (2013.01); *C08G 77/14* (2013.01); *C09D 183/06* (2013.01); *C09J 183/06* (2013.01);
(Continued)

(58) Field of Classification Search
CPC ............... H01L 51/442; H01L 51/5206; H01L 51/5221; C08G 77/14; C09D 183/06
See application file for complete search history.

(56) References Cited

U.S. PATENT DOCUMENTS 5,439,962 A * 8/1995 Yamaguchi .......... C08K 5/5406
106/287.14
2012/0152343 A1 6/2012 Cheng et al.
(Continued)

FOREIGN PATENT DOCUMENTS

| CN | 104736641 A | 6/2015 |
|---|---|---|
| EP | 1837931 A2 | 9/2007 |

(Continued)

OTHER PUBLICATIONS

Machine Translation of WO-2015/152559 (Year: 2015).*
Machine Translation of JP-2009/029108 (Year: 2009).*
Machine Translation of KR-2013/0019607 (Year: 2013).*

*Primary Examiner* — Mounir S Amer
*Assistant Examiner* — Alexander Belousov
(74) *Attorney, Agent, or Firm* — Laine IP Oy

(57) ABSTRACT

A display has a plurality of pixels in a matrix, the pixels each comprising a liquid crystal layer and/or light emitting diode layer, a plurality of substrates, at least a first substrate being optically transmissive to visible light, an electrode formed on one of the substrates and having electrically conductive material that has an electrical resistivity of less than 200 Ω/sq and that comprises a siloxane material and particles having an average particle size of less than 10 microns.

10 Claims, 13 Drawing Sheets

(51) Int. Cl.
  *C08G 77/14* (2006.01)
  *H01L 51/52* (2006.01)
  *C09D 183/06* (2006.01)
  *C09J 183/06* (2006.01)

(52) U.S. Cl.
  CPC ...... *H01L 51/0096* (2013.01); *H01L 51/5206* (2013.01); *H01L 51/5221* (2013.01); *H01L 2251/5369* (2013.01); *Y02E 10/549* (2013.01)

(56) References Cited

U.S. PATENT DOCUMENTS

| | | | |
|---|---|---|---|
| 2015/0137049 A1 | 5/2015 | Mittal et al. | |
| 2015/0299397 A1* | 10/2015 | Kusunoki | C08G 77/045 549/215 |
| 2016/0204369 A1* | 7/2016 | Ferrini | H01G 9/209 136/256 |
| 2017/0152350 A1* | 6/2017 | Heikkinen | C08K 3/22 |
| 2017/0162828 A1* | 6/2017 | Mackerron | H01L 51/5268 |
| 2018/0174703 A1* | 6/2018 | Lee | B82Y 10/00 |

FOREIGN PATENT DOCUMENTS

| | | |
|---|---|---|
| JP | 2009029108 A | 2/2009 |
| KR | 20130019607 A | 2/2013 |
| KR | 20150116396 A | 10/2015 |
| WO | WO2013100550 A1 | 7/2013 |
| WO | WO2014059577 A1 | 4/2014 |
| WO | WO2014069296 A1 | 5/2014 |
| WO | WO2015151489 A1 | 10/2015 |
| WO | WO2015152559 A1 | 10/2015 |

\* cited by examiner

ELECTRICALLY CONDUCTIVE SILOXANE PARTICLE FILMS, AND DEVICES WITH THE SAME

TECHNICAL FIELD

The present invention relates to electrodes and films, in particular transparent electrodes and films, to displays and photovoltaic cells, as well as to methods of making electrodes, displays and photovoltaic cells.

BACKGROUND

There is a need for optically transparent and electrically conductive layers, such as replacements for indium tin oxide (ITO) layers in displays, or as replacements for aluminum tin oxide (ATO) layers. ITO is often used to make transparent electrically conductive coatings for displays, such as liquid crystal displays, plasma displays, LED displays (e.g. OLED displays e.g. where ITO is used as the anode), touch sensitive displays, e-books, etc. ITO layers are also used in photovoltaic technology (solar cells), among other areas. ATO layers are less stable than ITO layers, and ITO layers suffer from conductivity problems in larger displays, as well as the problem that indium is an increasingly scarce and expensive material, and with ITO deposition being an expensive and slow vacuum process.

SUMMARY

An optically transparent, electrically conductive, nanoparticle-siloxane composite electrode is disclosed, along with devices incorporating the same. Conductive particles, which can be spherical, branched or wires, are deposited within or are surrounded with a siloxane composite. Low aspect ratio particles are arranged in lines or patterns to reach electrical percolation. Alternatively high aspect ratio particles are randomly dispersed within or underneath a siloxane material in sufficient concentration to reach electrical percolation threshold. Preferably in either case, high optical transmission is achieved, and the total surface area of conductive metal and siloxane composite is low having been patterned.

The transparent and conductive film can be formed in one simultaneous coating step, or two consecutive coating steps. The coating can be also patterned according to various patterning processes disclosed herein. The formed transparent electrically conductive electrode preferably comprises at least one type of electrically conductive particles such as high aspect ratio particles, e.g. nanowires, and at least one type of siloxane polymer. If desired, additional low aspect ratio particles, e.g. nanoparticles, can be included to adjust the film's refractive index, thermal conductivity, electrical conductivity, mechanical properties, thermal stability or chemical resistance. As disclosed herein the transparent electrode can be part of a touch sensor, display, OLED device, vertical emitter InGaN LED, IME shield, or part of any other device that can benefit from electrically conductive and transparent films.

As disclosed herein, in one particular example a display has a plurality of pixels in a matrix, the pixels each comprising a liquid crystal layer and/or light emitting diode layer, a plurality of substrates, at least a first substrate being optically transmissive to visible light, an electrode formed on one of the substrates and having electrically conductive material that has a sheet resistance of 200 Ω/sq or less, and that comprises a siloxane material and particles having an average particle size of less than 10 microns.

In another particular example, a photovoltaic cell, has a first substrate, formed on or in the first substrate, a base layer and an emitter layer, and an electrode layer formed on the emitter layer, wherein the electrode layer has a transmissivity to visible light of at least 85%, and a sheet resistance of 200 Ω/sq or less, and wherein the electrode layer comprises a siloxane material and particles having an average particle size of less than 10 microns.

More specifically, the present invention is mainly characterized by what is stated in the characterizing parts of the independent claims.

Considerable advantages are obtained. Thus, for example, the present invention achieves improvement of overall optical and lifetime qualities of the disclosed devices. The present siloxane particle composition is optically transmissive in the visible spectrum and typically electrically conductive. It can be used in place of ITO or ATO, and optionally as a replacement for any electrically conducting film or layer other than ITO/ATO.

The present siloxane-particle composition has numerous fields of application. Thus, it can be used as an adhesive or encapsulant in electronics or optoelectronics packaging, LED and OLED front and back end processing, 3D, photovoltaic and display metallization, in place of soldering e.g. solder bumps in semiconductor packaging, printed electronics, OLED low work function cathode ink, ITO replacement ink, metal mesh and other electrodes, high resolution photovoltaic paste, LMO cathode paste, photovoltaics, power electronics and EMI, touch sensor and other displays, heat or UV curable encapsulants or dielectrics.

Further uses and advantages of embodiments will appear from the following description.

BRIEF DESCRIPTION OF THE DRAWINGS

Example embodiments will be more clearly understood from the following detailed description taken in conjunction with the accompanying drawings, in which.

DESCRIPTION OF EMBODIMENTS

Figure 1A:
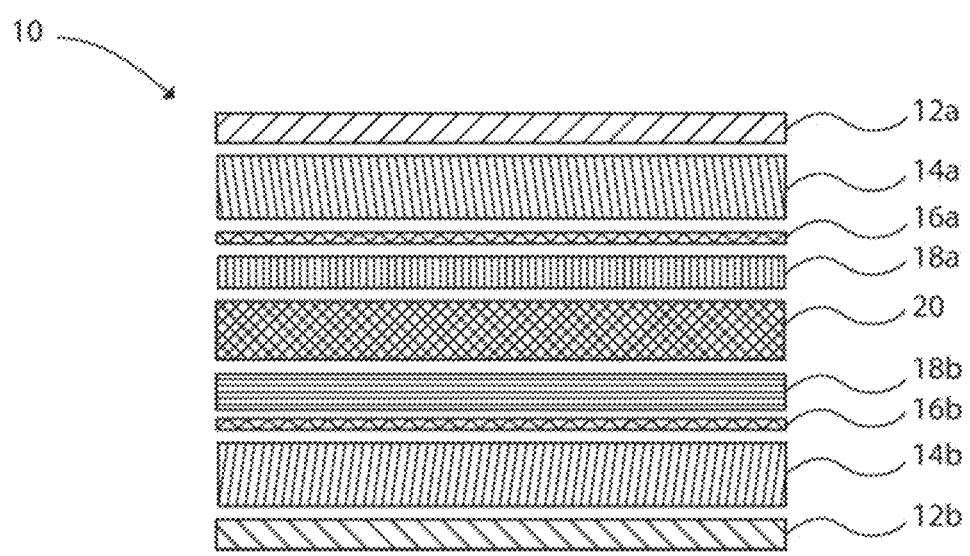
FIG. 1a is an expanded cross sectional view of a liquid crystal pixel.

Various example embodiments will be described more fully hereinafter with reference to the accompanying drawings, in which some example embodiments are shown. The present inventive concept may, however, be embodied in many different forms and should not be construed as limited to the example embodiments set forth herein. Rather, these example embodiments are provided so that this description will be thorough and complete, and will fully convey the scope of the present inventive concept to those skilled in the art. In the drawings, the sizes and relative sizes of layers and regions may be exaggerated for clarity.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on", "directly connected to" or "directly coupled to" another element or layer, there are no intervening elements or layers present. Like numerals refer to like elements throughout. As used herein, the term "and/or" includes any and all combinations of one or more of the associated listed items.

It will also be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present inventive concept.

The terminology used herein is for the purpose of describing particular embodiments only and is not intended to be limiting. As used herein, the singular forms "a," "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another elements as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

It is noted that, as used herein, the singular forms of "a", "an" and "the" include plural referents unless the context clearly dictates otherwise. It will be further understood that the term "comprises" and/or "comprising", when used in this specification, specify the presence of stated features, steps, operations, elements, and/or components, but do not preclude the addition of one or more other features, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

A siloxane particle composition that is optically transmissive in the visible spectrum and that is electrically conductive, and that can be used in place of ITO or ATO, is desirable, as well as as a replacement for any electrically conducting film or layer other than ITO/ATO. Semiconductor devices and microelectronic and optoelectronic devices, such as displays, utilize electrically conductive layers throughout. In particular, though not limited thereto, are touchscreen displays, such as resistive or capacitive touchscreens for smartphones, tablets, laptops and notebooks, computer monitors, as well as touchscreens on digital cameras, camcorders, portable game devices, personal multimedia players, e-book readers, printers, automotive displays, GPS/PND navigation devices, etc as well as touchscreens in retail, commercial and industrial environments.

However non-touchscreen versions of such products may also benefit from the siloxane particle materials disclosed herein.

As can be seen in FIG. 1a, an expanded view of a simplified liquid crystal cell 10 is shown. As illustrated in FIGS. 1, 12a and 12b are polarizers, with 14a and 14b being glass substrates. Also shown are 18a and 18b, which are rubbed alignment layers (PVA, PVK, polyimide, etc.), in between which is a twisted nematic liquid crystal layer. Layers 16a and 16b are a siloxane-particle layer (which traditionally has been an ITO layer). One of the layers 16a or 16b may be an ITO layer, with the other layer being the siloxane-particle layer. Preferably both layers 16a and 16b are the siloxane-particle material. The LCD pixel can be passive matrix or active matrix, and can have any of a wide variety of designs. For example, it is possible to form both electrodes on the same glass substrate, such as in an in-plane-switching (IPS) type LCD pixel. Also VA LCD panels (MVA or PVA) are also possible. Regardless of the type of LCD pixel, backlighting is needed to direct light through the pixel (or onto the pixel in the case of LCOS), which is typically provided by LED backlights. Regardless of the exact pixel design however, common among them is a patterned electrically conductive and optically transparent layer acting as the LCD circuitry for activating the LCD pixels in the LCD pixel array, and wherein the patterned electrically conductive and optically transparent layer is formed of the siloxane particle composition as disclosed herein.

In a resistive type touch screen, a flexible clear top substrate (e.g. a plastic film such as polyester) is disposed spaced apart from a more rigid bottom substrate (e.g. a glass substrate) with an air gap therebetween. Both the flexible top substrate and the bottom substrate can be uniformly coated with an electrically conductive siloxane particle film as disclosed herein. When a user's finger touches the flexible top substrate, it deflects so as to make contact with the bottom substrate. The voltage at the point of contact can be measured and the location of the point of contact calculated.

In a capacitive type touch panel, on the display (e.g. an array of LCD or LED pixels) is connected an additional substrate or substrates, which can be any suitable material such as glass, polyester, acrylic, etc. The substrate(s) have a matrix of electrically conducting lines formed from patterning the electrically conductive siloxane particle material as disclosed herein. A top cover lens is bonded to enclose the whole assembly. When a user's finger touches the cover substrate, it increases the measured capacitance of the electrodes nearest to the point of touch, where the change in capacitance can be measured and used to calculate the location of the touch. Surface capacitive or projected capacitive examples can both incorporate the electrically conductive material as disclosed herein.

Figure 1B:
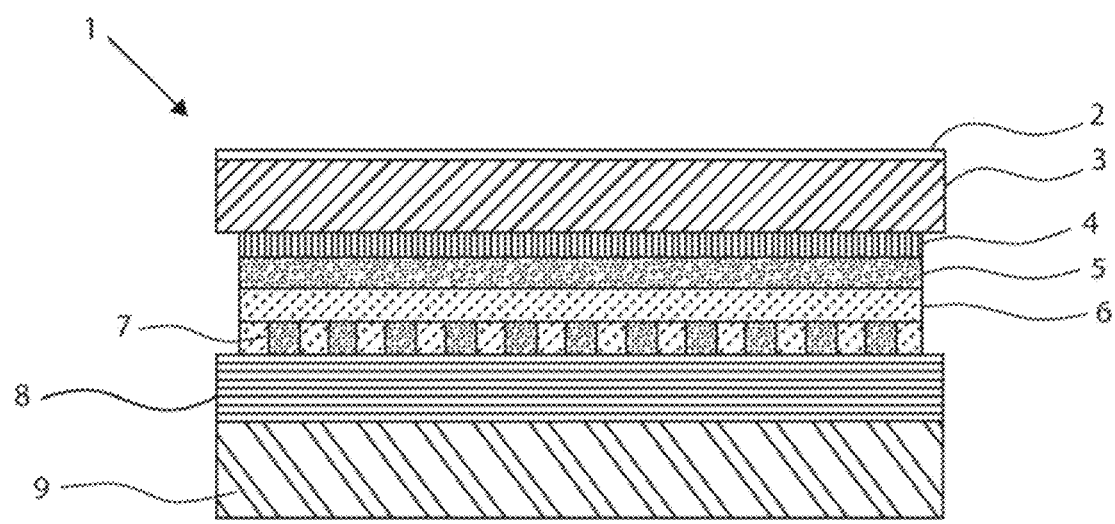
FIG. 1b is a cross sectional view of a touch screen display.

As can be seen in FIG. 1b, a cross section of an exemplary capacitive touch display 1 is illustrated. As shown in 1b, 9 is a simplified view of the liquid crystal display layers (liquid crystal material, color filters, supporting substrate(s) etc.). Disposed thereon is a light transmissive substrate 8, which can be any suitable material such as glass, polyester, acrylic etc. On substrate 8 are electrically conductive patterns 7, which are lines extending out of the plane of FIG. 1b and are made of electrically conductive siloxane particle material as disclosed herein. These conductive bands extend across the length of the display. Formed on the conductive bands is a capacitor layer—an insulating layer 6, which can be deposited so as to fill in the spaces between the conductive bands 7 and form an insulating layer above. This insulating layer can be the siloxane material as disclosed herein, either without particles or with particles selected to provide an electrically insulating layer, such as ceramic particles (e.g. oxide or nitride particles) Both the electrically conducting bands 7 and dielectric layer 6 should be transmissive to visible light, preferably each transmitting at least 70% of visible light incident thereon, though more preferably at least 80%, and more preferably at least 90%, at least 92.5%, or at least 95%.

As can further be seen in FIG. 1b, an additional layer of patterned electrically conductive bands 5 are provided. In this case, the conductive bands are formed as strips extending perpendicularly (or otherwise not parallel) to the bands 7 on the opposite side of dielectric layer 5. Conductive lines 5 can be the driving lines of the display and conductive lines 7 can be the sensing lines. Also shown is an upper light transmissive substrate 3, which can be glass, polyester, acrylic or other suitable material that is transmissive to light in the visible spectrum. Substrate 3 is adhered via adhesive 4, that should also be transmissive to visible light, and which can be made with the siloxane material as disclosed herein, with or without the particles therein. Utilizing the same or similar material for multiple layers in the device helps with matching CTE and refractive indices and can improve the overall optical and lifetime qualities of the device.

Areas between conducting bands 5 (or conducting bands 7) can be air, a dielectric material such as the siloxane material as disclosed herein, or may contain siloxane material and electrically conductive particles (including nanowires) that have been developed so as to lose their electrical conductivity (to be discussed further below). Note that area 9 may be display pixels other than LCD pixels (plasma, LED etc), and that the conductive siloxane particle material may be incorporated within the liquid crystal display 9, such as with in-cell touch displays. On-cell, in-cell and out-cell touch displays can all use the electrically conductive siloxane material as disclosed herein.

As mentioned throughout, the electrically conducting material can be particles, such as microparticles or nanoparticles, and this filler material that provides electrical conductivity can also be nanowires or nanotubes. High aspect ratio elongated structures, such as nanowires or nanotubes, are beneficial, such as those that have aspect ratios of more than 10:1, such as more than 25:1, more than 50:1 or even more than 100:1. The particles (or nanowires etc) can be provided to the siloxane material with or without surface treatment. If surface treated first, the surface can be coated with an organic material such as carboxylic acid, PVP or PVA, and could be an amine, thiol, silane or combination thereof.

Though no solvent is necessary for the application of the siloxane composition, if very thin layers are desired, it may be desirable to add an organic solvent, non polar or polar (protic or aprotic), so as to provide the siloxane material as a low viscosity liquid in order to minimize the deposited layer's thickness. Lowering the molecular weight of the siloxane polymer that is part of the composition, or using monomers (e.g. the first, second and/or third compounds) in place of the siloxane polymer in the composition, can lower the viscosity and aid in minimizing the film thickness if desired. Surfactants and UV sensitive additives that enable the siloxane composition to react upon exposure to UV light can be added. Selecting the functional reactive group as acrylate can aid in polymerization under UV light. Optionally, metal salts such as silver nitrate, silver halide, silver acetate, silver carboxylic acid (or other metal salts for other metals) that upon UV or thermal treatment reduce to the elemental metal, e.g. pure silver, with or without particles also being added, is possible. If a metal salt is added, preferably it is a low work function metal forming compound, such as cesium carboxylic acid salt that upon UV or thermal reduces to its pure metal form, or more preferably at main metal surface. It is also possible to provide an additional layer on the siloxane particle layer, which is a thin low (or high) electrical work function coating.

Figure 2:
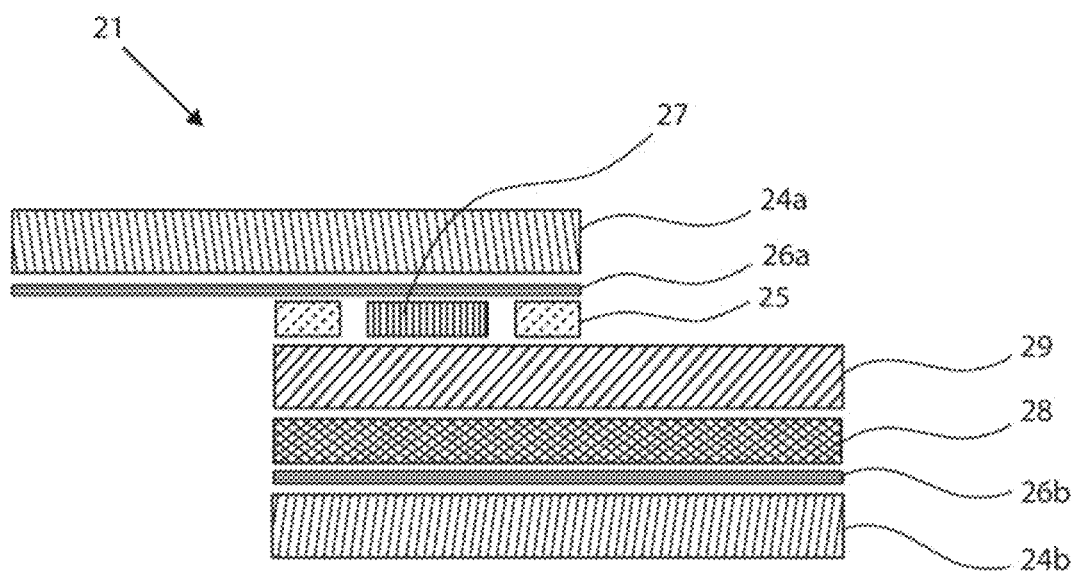
FIG. 2 is an expanded cross sectional view of a light emitting diode pixel.

The films as disclosed herein are not limited to use in LCD displays, but have a wide variety of applications, such as where patternable electrically conductive transparent layers are desired, such as in LED displays and in photovoltaic cells. As can be seen in FIG. 2, an expanded view of a simplified organic light emitting diode 21 (OLED) is illustrated. Substrates 24a and 24b are glass or other suitable material. 28 is a hole transport layer emitting layer (e.g. MEH-PPV—(poly[2-methoxy-5-(2'-ethyl-hexyloxy)-1,4-phenylene vinylene])). 25 in FIG. 2 is a sealant or adhesive, whereas 27 is the cathode (e.g. Gain). At least one of layers 26a and 26b are the siloxane-particle layer as disclosed herein. Either 26a or 26b could be an ITO layer (and typically have both been ITO layers in the prior art). However, preferably both 26a and 26b are formed of the siloxane-particle material, with 26b acting as the anode of the OLED pixel. As in the LCD example in FIG. 1, the siloxane particle layer is preferably electrically conductive and optically transparent to visible light, and if disposed on or proximate to a light transmissive substrate, is likewise preferably transmissive to visible light. It is also possible that only substrate 24a is optically transmissive to visible light, whereas substrate 24b is not optically transmissive (substrate 24b may be an amorphous silicon or polycrystalline silicon substrate that has formed thereon a thin film transistor array, such as in one type of amoled pixel. In one example, the anode is formed of the siloxane particle material on a glass substrate, and the cathode is formed from a different material on the other glass substrate. In another example, the anode is formed within the TFT area on the silicon substrate and the cathode is formed on the opposing glass substrate and is formed from the siloxane particle composition disclosed herein. In other examples, both the anode and cathode are formed of the siloxane particle material. The siloxane particle material is suitable for a traditional OLED display, but also for flexible OLED displays (or other flexible display panels) due to the bendability of the siloxane material, something that brittle ITO is not easily capable of.

Figure 3:
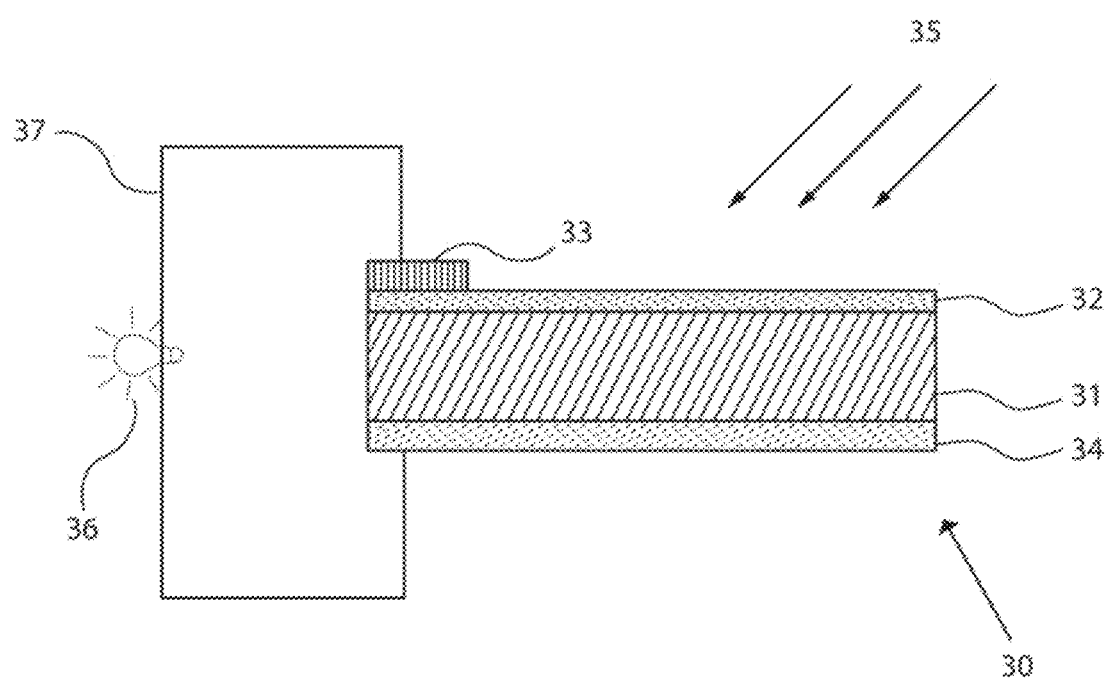
FIG. 3 is a cross sectional view of a photovoltaic cell.

As shown in FIG. 3, a simplified view of a silicon solar cell 30 is shown having a substrate 31 of a p-type semiconductor, and an emitter layer 32 of an n-type silicon semiconductor. A p-n junction is formed at the interface between layers 31 and 32. When sunlight 35 is incident on the solar cell, electrons created in emitter layer 32 of the n-type silicon semiconductor electron holes create in the substrate 31 of a p-type silicon semiconductor by photovoltaic effect are drawn toward the n-type silicon semiconductor and the p-type silicon semiconductor, and move to top electrode 33 on the emitter layer 32 and bottom electrode 34 respectively. When the top electrode 33 and the bottom electrode 34 are connected to each other, electrical current flows via circuit 37 powering an electric load 36. The photovoltaic material used can be a thin film amorphous silicon layer, cadmium telluride, copper indium gallium selenide, or a dye sensitized solar cell material. It is also possible that the semiconductor material is a traditional crystalline silicon substrate.

Conventionally, a silver paste composition is used to form the preferably patterned top electrode 103, and an aluminum paste composition is used to form the bottom electrode 104. However preferably one or both of electrodes 34 and 36 are formed of the siloxane particle composition as disclosed herein.

Figure 4:
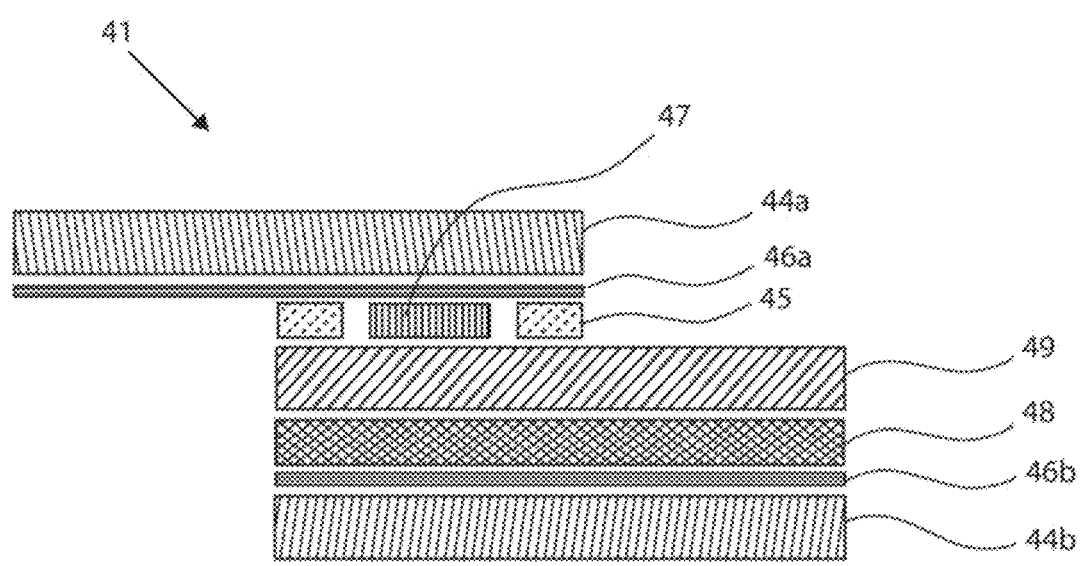
FIG. 4 is a cross sectional view of an organic photovoltaic cell.

Illustrated FIG. 4 is an organic photovoltaic solar cell 41. Substrates 44a and 44b are glass or other suitable material. 48 is a hole transport layer (e.g. PEDOT:PSS—(poly(3,4-ethylenedioxythiophene)-poly(styrenesulfonate))), whereas 49 is a layer of a mixed solution of electron- and hole-transport polymers, such as PCBM:MDMO-PPV (methano [60]fullerene [6,6]-phenyl C61 butyric acid methyl ester:poly[2-methoxy-5-(3',7'-dimethyloctyloxy)-p-phenylene vinylene]). 45 in FIG. 4 is a sealant or adhesive, whereas 47 is the cathode (e.g. Gain). At least one of layers 46a and 46b are the siloxane-particle layer as disclosed herein. Either 46a or 46b could be an ITO layer (and typically have both been ITO layers in the prior art). However, preferably both 46a and 46b are formed of the siloxane-particle material, with 46b acting as the anode of the OLED pixel.

Figure 5:
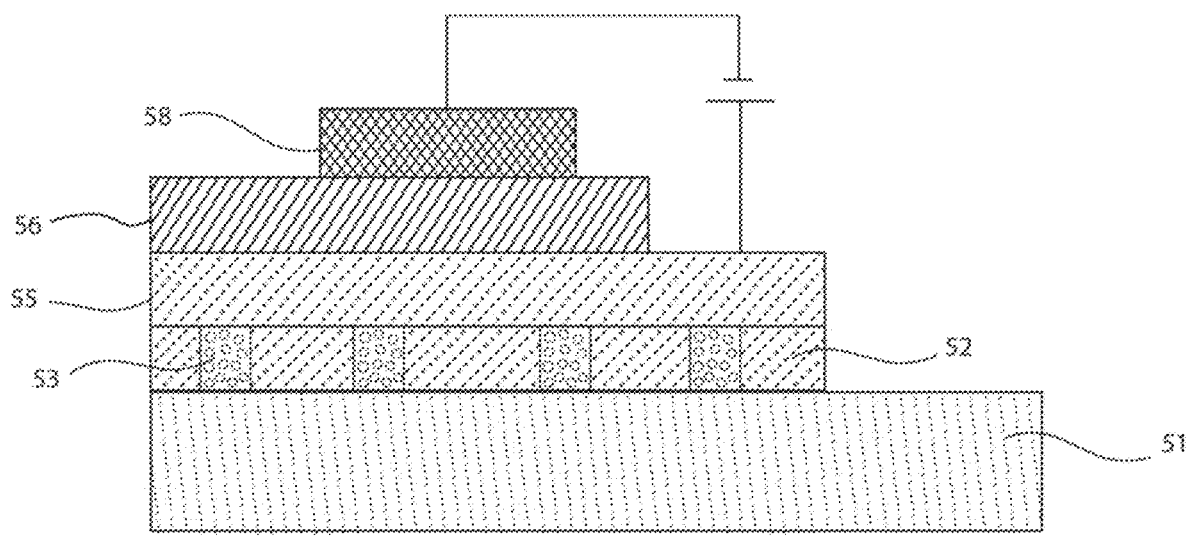
FIGS. 5 and 6 are further cross sectional views of photovoltaic cells.
Figure 6:
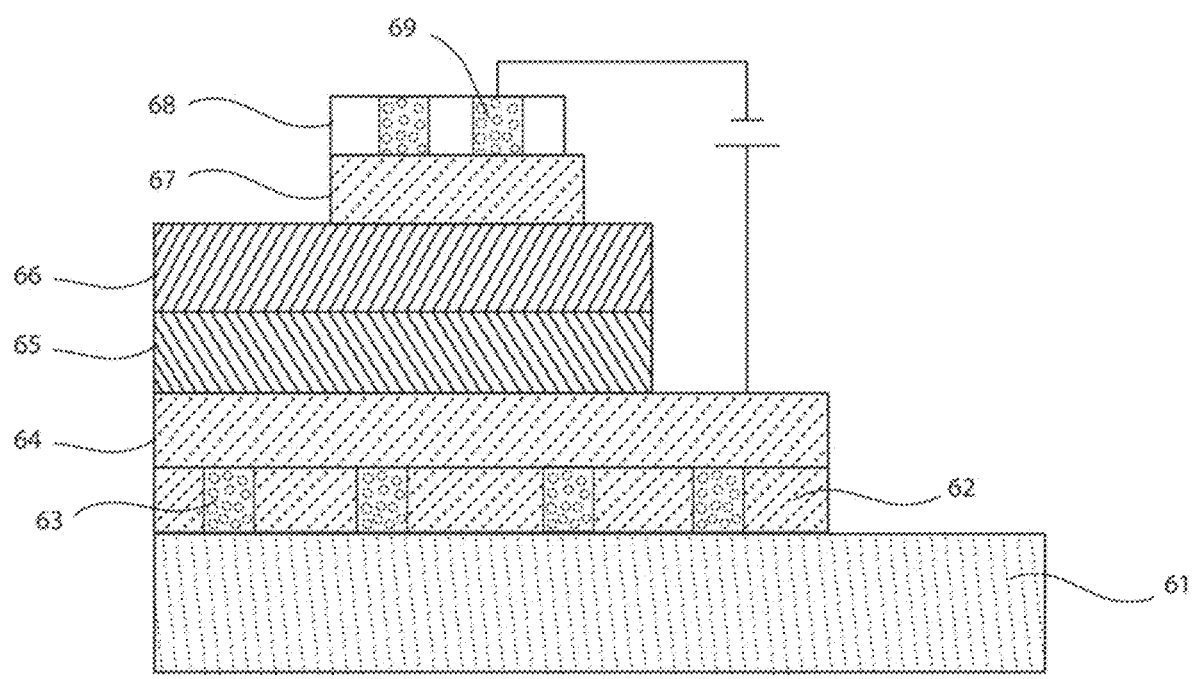

As can be seen in FIG. 5, an organic photovoltaic cell is illustrated, with a substrate 51 that has thereon a metal grid layer formed of an electrically conductive portion 53 and an e.g. PEDOT:PSS portion 52. Disposed thereon is an e.g. PEDOT:PSS layer 55, as well as an active layer 56 and a metal layer 58. Metal layer can be e.g. an Al layer, or a siloxane particle layer such as comprising aluminum particles. Electrically conductive portion 53 can be the siloxane particle material as disclosed herein, such as one comprising silver particles. As can be seen in FIG. 6, a substrate 61 has thereon a metal grid layer formed of an electrically conductive portion 63 and an e.g. PEDOT:PSS portion 62. Disposed thereon is an e.g. PEDOT:PSS layer 64, as well as an electron transport layer 65 and an active layer 66. Also illustrated is another e.g PEDOT:PSS layer 67, as well as an additional patterned metal layer 69. As with FIG. 5, both of the metal grid/patterned electrically conductive layers in FIG. 6 can be formed of the siloxane particle material as disclosed herein to preferably provide an electrically conductive and optically transmissive material. The particles can be silver or another suitable metallic particle that provides the desired characteristics of this conductive portion within a photovoltaic cell. Of course other photovoltaic designs and materials are possible.

In addition to the particles disclosed above, it is possible to provide the desired electrically conductive, optically transmissive, and photopatternable properties with a siloxane nanowire composition. The nanowires can be any suitable nanowires, though preferably metal nanowires comprising an electrically conductive metal such as silver, copper, gold, aluminum, tungsten, nickel, platinum, etc. Though the term "nanowires" is used herein, it is also possible that the nanostructures are hollow ("nanotubes"). Also, the nanowires may be formed of alloys of multiple metals, or may be multilayered having one or more inner metal layers covered by one or more outer metal layers. In one example, the nanowire has an inner layer of copper with an outer layer of silver, with an optional intervening layer of nickel. The nanowires may also be made of a semiconductor material, or may be a nitride, carbide or oxide compound, as mentioned earlier, or made of any suitable materials as mentioned above with respect to the particles. The nanowires may be made by vapor liquid solid synthesis, such as by using liquid metal nanocluster catalysts, or solution phase synthesis where nanowires are grown in solution.

Figure 7A:
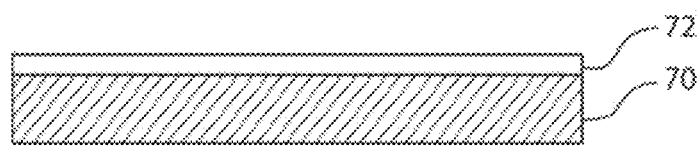
FIGS. 7a to 7d are an illustration of one method for patterning a siloxane particle layer.

As can be seen in FIGS. 7a to 7d, a UV patternable deposition method is illustrated. In FIG. 7a, a substrate 70 can be provided that is any suitable substrate such as glass, quartz, sapphire, polymer, semiconductor etc. On substrate 70 is deposited a siloxane composition as disclosed herein and preferably comprising particles as disclosed hereinabove. The siloxane particle composition can be deposited as a fluid, e.g. a liquid or gel, preferably dispensed by a process such as syringe deposition or screen printing. Other deposition methods could be used, such as spin-on, dip, ink-jet, curtain, drip, roller, gravure, reverse offset, extrusion coating, slit coating, spray coating, flexo-graphic, etc. Also, substrate 70 may or may not have been singulated from a wafer, but could instead be a whole wafer, or a portion cut from large sheets, such as large glass sheets used for display panels, solar cells, or the like. Depositing on large sheets in a roll to roll process is possible. Furthermore, substrate 70 could be adhered to the support substrate at the wafer level, with both the substrates singulated together into individual die. For displays or photovoltaic cells, preferred is a deposition method that can be incorporated into a roll to roll process.

Figure 7B:
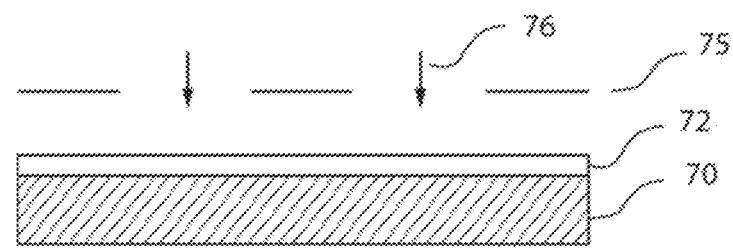
Figure 7C:
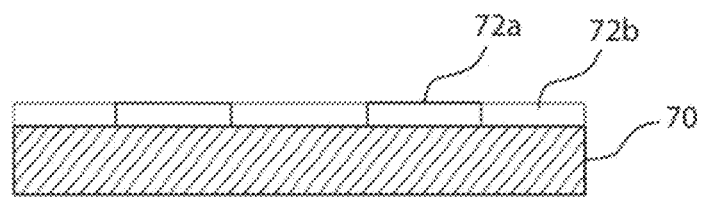
Figure 7D:
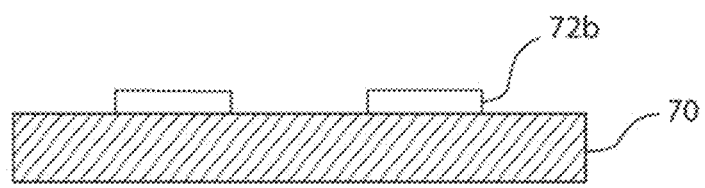
Figure 8A:
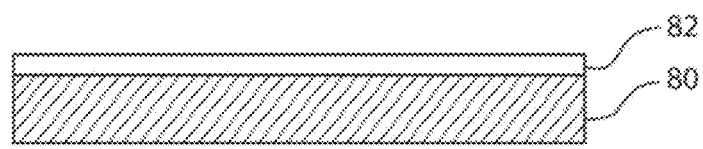
FIGS. 8a to 8d illustrate an additional example for patterning the siloxane particle layer.
Figure 8B:
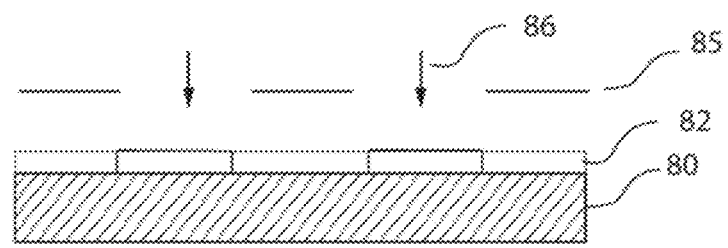
Figure 8C:
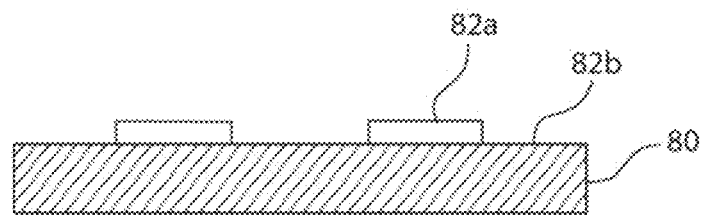
Figure 8D:
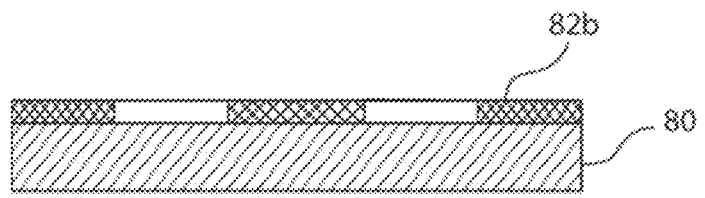

As can be seen in FIG. 7b, a mask 75 is disposed adjacent the siloxane layer and UV light is provided to the siloxane layer via apertures in the mask. The UV light cures and hardens the siloxane layer in the exposed areas 72a, whereas the unexposed areas 72b remain soft (FIG. 7c). As can be seen in FIG. 7d, a developer is used to remove unexposed areas 72b leaving pattern 72a in place. Various baking or drying steps may be used, such as a soft bake after initial application of the siloxane material 72, and a hard bake after removal of the unexposed areas 72b.

As an alternative to using a mask to directly pattern the siloxane material as discussed above, it is also possible to pattern the siloxane material via a photoresist layer deposited thereon. In such a process, after deposition and soft bake of the siloxane layer, a photoresist layer is deposited thereon. The photoresist can be any suitable photoresist material, including a positive photoresist where the part of the photoresist that is exposed to light becomes soluble to the photoresist developer and where the part of the photoresist that is not exposed to light remains insoluble to the developer. Or, a negative photoresist can be used where the part of the photoresist that is exposed to light becomes insoluble to the developer and the unexposed part of the photoresist is soluble to the developer. Any suitable photoresist, such as SU-8, PMMA, DNQ/Novolac, PMGI, etc can be used. Regardless of the type of photoresist used, when the pattern is formed within the photoresist material, the pattern acts as a mask for patterning the underlying siloxane material, so as to ultimately form a patterned siloxane layer.

As mentioned hereinabove, the siloxane particle layer is preferably electrically conductive, optically transmissive, and patternable. However, it is also possible to provide a siloxane particle layer for heat dissipation, in view of the general problem of heat buildup in consumer and other devices. The siloxane layer could therefore be provided as a thermally conductive layer, such as one that is optically transmissive, patterned or not, and not electrically conductive. The particles that are of an electrically insulating material (various nitrides, oxides etc as mentioned herein) can be selected for their thermally conductive but electrically insulating properties. Of course, if the substrate is not optically transmissive, or the position within the device does not require high optical transmissivity in the visible spectrum, the thermally conductive and electrically insulating layer may be light reflecting or light absorbing, depending upon the particles (type, quantity and size) selected.

The siloxane composition may comprise coupling agents, curing agents, antioxidants, adhesion promoters and the like, as disclosed herein. In particular, the siloxane material comprises reactive groups on the Si—O backbone that are reactive upon the application of incident UV light. The developer can be any suitable developer, such as TMAH, KOH, NaOH etc. It is possible, depending upon the siloxane material selected, and the type of nanowires selected (material, aspect ratio, etc) that the developer process inactivates the nanowires leaving them in degraded and low electrically conductive state. As such degraded nanowires as such in the exposed areas may remain on substrate 50 without interfering with the desired electrically conductive areas adjacent thereto. It is also possible to pattern the siloxane material with laser patterning, instead of UV light.

As can be seen in FIG. 8, an alternative process is illustrated for providing a mesh of conductive siloxane material, or otherwise an area with portions electrically conductive and other portions electrically insulating. As shown in FIG. 8a, on a substrate 80 is deposited a dielectric layer 82. The dielectric layer can be any suitable insulating film, though preferred is the siloxane material as disclosed herein, with or without particles therein. If particles are present, they should be ones that do not provide electrically conducting properties—e.g. ceramic particles (nitride, oxide or oxynitride particles for example). As shown in FIG. 8b, layer 82 is patterned such as with UV light. The patterning could also be with laser patterning or other suitable process such as hot embossing. Once layer 82 is exposed to the UV light 86 via mask 85 the unexposed portions are removed so as to leave empty areas or grooves 82b and dielectric portions 82a on substrate 80 (FIG. 8c). Thereafter, an electrically conducting material is provided to the empty areas, so as to provide an electrically conducting pattern on substrate 80 (FIG. 8d).

For FIG. 8, the electrically conducting material could be a known metallic ink or other known material for providing en electrical conductive portion, or preferably is a siloxane particle material as disclosed herein. The particles could be any suitable metal particles (or conductive ceramic particles), such as silver particles, or multi-layer particles with silver as one of the layers. If a siloxane material is used for both the electrically conducting and electrically insulating portions, in one example both siloxanes have a similar, or preferably the same organic substituent (e.g. the R2 group of the first compound $SiR^1_a R^2_{4-a}$ where a is from 1 to 3, $R^1$ is a reactive group, and $R^2$ is an alkyl group or an aryl group, as mentioned hereinabove, or that the same monomer $SiR^1_a R^2_{4-a}$ is used for making the siloxane polymer for both the electrically conducting and electrically insulating materials. This helps with film stability and closer CTE values for the conducting and insulating portions. Also, in examples where electrically insulating material is disposed in a different layer than the electrically conducting material, such as for the capacitor portion between patterned electrically conductive layers in a capacitive touch screen display, the same $R^2$ group and/or same starting monomer can be used.

An alternative method of forming the patterned electrically conductive layer, it is possible to first deposit the particles, e.g. nanowires onto a substrate separately from the siloxane material. In such a case, the nanowires can be deposited in an organic solvent or aqueous solvent solution to form a nanowire 'matrix' on the substrate. After drying or other suitable method for removing the solvent, a nanowire 'film' remains. Thereon is deposited the siloxane material as disclosed herein. The siloxane material can be deposited with a solvent, with further drying and polymerization (e.g. application of heat and/or UV light) of the siloxane, to form a combined finally cured siloxane nanowire layer. Or the siloxane can be deposited without any added solvent at a desired molecular weight that provides the desired viscosity, followed by application of heat or UV light to harden and cure the siloxane material. It is also possible to provide silicon containing monomers at this stage (e.g. the first compound, second compound, or other optional components e.g. optional third compound, coupling agents etc) followed by the application of heat and/or UV light layer comprising nanowires and polymerized siloxane. It is possible to provide these siloxane monomers, or the siloxane polymer, mixed with particles, e.g. nanoparticles that will, upon the application of heat for example, sinter or melt and help to interconnect the nanowires. Of course nanotubes, or other types of nanoparticles can be used in place of nanowires. It is also possible to photopattern the siloxane film and either damage or remove areas with nanotubes selectively, e.g. with a developer, so as to form a patterned electrically conductive layer.

The electrically conducting layers as disclosed herein can be provided as multiple layers within a device, such as a first patterned electrically conducting siloxane particle layer, and a second electrically conducting layer (patterned or not). It is also possible to have areas between the electrically conducting portions within the same layer that are of the same or similar siloxane material but with no particles or particle that do not provide electrical conductivity. Also, an intervening dielectric layer could be provided between the plurality of electrically conducting siloxane layers. With both the electrically conducting and electrically insulating portions made from the same or similar siloxane material as disclosed herein, problems of CTE mismatch can be lowered.

More particularly with regard to the siloxane particle composition referred to hereinabove, a composition is made where at a siloxane polymer is provided. Preferably the polymer has a silicon oxide backbone, with aryl (or alkyl) substituents as well as functional cross-linking substituents. A filler material is mixed with the siloxane polymer. The filler material is preferably particulate material comprising particles having an average particle size of 100 microns or less, preferably 10 microns or less. A catalyst is added, the catalyst being reactive with the functional cross-linking groups in the siloxane polymer when heat or UV light (or other activation method) is provided to the composition. A monomeric (or oligomeric) coupling agent(s) are included in the composition, preferably having functional cross-linking groups that are likewise reactive upon the application of heat or light as in the siloxane polymer. Additional materials such as stabilizers, antioxidants, dispersants, adhesion promoters, plasticizers, softeners, and other potential components, depending upon the final use of the composition, can also be added. Though a solvent could be added, in a preferred embodiment the composition is solvent-free and is a viscous fluid without solvent which is stored and shipped as such.

As noted above, the composition being made as disclosed herein, comprises a siloxane polymer. To make the siloxane polymer, a first compound is provided having a chemical formula $SiR^1{}_aR^2{}_{4-a}$ where a is from 1 to 3, $R^1$ is a reactive group, and $R^2$ is an alkyl group or an aryl group. Also provided is a second compound that has the chemical formula $SiR^3{}_bR^4{}_cR^5{}_{4-(b+c)}$ where $R^3$ is a cross-linking functional group, $R^4$ is a reactive group, and $R^5$ is an alkyl or aryl group, and where b=1 to 2, and c=1 to (4−b). An optional third compound is provided along with the first and second compounds, to be polymerized therewith. The third compound may have the chemical formula $SiR^9{}_fR^{10}{}_g$ where $R^9$ is a reactive group and f=1 to 4, and where $R^{10}$ is an alkyl or aryl group and g=4−f. The first, second and third compounds may be provided in any sequence, and oligomeric partially polymerized versions of any of these compounds may be provided in place of the above-mentioned monomers.

The first, second and third compounds, and any compounds recited hereinbelow, if such compounds have more than one of a single type of "R" group such as a plurality of aryl or alkyl groups, or a plurality of reactive groups, or a plurality of cross-linking functional groups, etc., the multiple R groups are independently selected so as to be the same or different at each occurrence. For example, if the first compound is $SiR^1{}_2R^2{}_2$, the multiple $R^1$ groups are independently selected so as to be the same or different from each other. Likewise the multiple $R^2$ groups are independently selected so as to be the same or different from each other. The same is for any other compounds mentioned herein, unless explicitly stated otherwise. A catalyst is also provided. The catalyst may be a base catalyst, or other catalyst as mentioned below. The catalyst provided should be capable of polymerizing the first and second compounds together. As mentioned above, the order of the addition of the compounds and catalyst may be in any desired order. The various components provided together are polymerized to create a siloxane polymeric material having a desired molecular weight and viscosity. After the polymerization, particles, such as microparticles, nanoparticles or other desired particles are added, along with other optional components such as coupling agents, catalyst, stabilizers, adhesion promoters, and the like. The combination of the components of the composition can be performed in any desired order.

More particularly, in one example, a siloxane polymer is made by polymerizing first and second compounds, where the first compound has the chemical formula $SiR^1{}_aR^2{}_{4-a}$ where a is from 1 to 3, $R^1$ is a reactive group, and $R^2$ is an alkyl group or an aryl group, and the second compound has the chemical formula $SiR^3{}_bR^4{}_cR^5{}_{4-(b+c)}$ where $R^3$ is a cross-linking functional group, $R^4$ is a reactive group, and $R^5$ is an alkyl or aryl group, and where b=1 to 2, and c=1 to (4−b).

The first compound may have from 1 to 3 alkyl or aryl groups ($R^2$) bound to the silicon in the compound. A combination of different alkyl groups, a combination of different aryl groups, or a combination of both alkyl and aryl groups is possible. If an alkyl group, the alkyl contains preferably 1 to 18, more preferably 1 to 14 and particularly preferred 1 to 12 carbon atoms. Shorter alkyl groups, such as from 1 to 6 carbons (e.g. from 2 to 6 carbon atoms) are envisioned. The alkyl group can be branched at the alpha or beta position with one or more, preferably two, C1 to C6 alkyl groups. In particular, the alkyl group is a lower alkyl containing 1 to 6 carbon atoms, which optionally bears 1 to 3 substituents selected from methyl and halogen. Methyl, ethyl, n-propyl, i-propyl, n-butyl, i-butyl and t-butyl, are particularly preferred. A cyclic alkyl group is also possible like cyclohexyl, adamantyl, norbornene or norbornyl.

If $R^2$ is an aryl group, the aryl group can be phenyl, which optionally bears 1 to 5 substituents selected from halogen, alkyl or alkenyl on the ring, or naphthyl, which optionally bear 1 to 11 substituents selected from halogen alkyl or alkenyl on the ring structure, the substituents being optionally fluorinated (including per-fluorinated or partially fluorinated). If the aryl group is a polyaromatic group, the polyaromatic group can be for example anthracene, naphthalene, phenanthere, tetracene which optionally can bear 1-8 substituents or can be also optionally 'spaced' from the silicon atom by alkyl, alkenyl, alkynyl or aryl groups containing 1-12 carbons. A single ring structure such as phenyl may also be spaced from the silicon atom in this way.

The siloxane polymer is made by performing a polymerization reaction, preferably a base catalyzed polymerization reaction between the first and second compounds. Optional additional compounds, as set forth below, can be included as part of the polymerization reaction.

The first compound can have any suitable reactive group $R^1$, such as a hydroxyl, halogen, alkoxy, carboxyl, amine or acyloxy group. If, for example, the reactive group in the first compound is an —OH group, more particular examples of the first compound can include silanediols such as diphenylsilanediol, dimethylsilanediol, di-isopropylsilanediol, di-n-propylsilanediol, di-n-butylsilanediol, di-t-butylsilanediol, di-isobutylsilanediol, phenylmethylsilanediol and dicyclohexylsilanediol among others.

The second compound can have any suitable reactive group $R^4$, such as a hydroxyl, halogen, alkoxy, carboxyl, amine or acyloxy group, which can be the same or different from the reactive group in the first compound. Group $R^5$, if present at all in the second compound, is independently an alkyl or aryl groups such as for group $R^2$ in the first compound. The alkyl or aryl group $R^5$ can be the same or different from the group $R^2$ in the first compound.

The cross-linking reactive group $R^3$ of the second compound can be any functional group that can be cross-linked by acid, base, radical or thermal catalyzed reactions. These functional groups can be for example any epoxide, oxetane, acrylate, alkenyl or alkynyl group.

If an epoxide group, it can be a cyclic ether with three ring atoms that can be cross-linked using acid, base and thermal catalyzed reactions. Examples of these epoxide containing cross-linking groups are glycidoxypropyl and (3,4-Epoxycyclohexyl)ethyl) groups to mention few If an oxetane group, it can be a cyclic ether with four ring atoms that can be cross-linked using acid, base and thermal catalyzed reactions. Examples of such oxetane containing silanes include 3-(3-ethyl-3-oxetanylmethoxy)propyltriethoxysilane, 3-(3-Methyl-3-oxetanylmethoxy) propyltriethoxysilane, 3-(3-ethyl-3-oxetanylmethoxy)propyltrimethoxysilane or 3-(3-Methyl-3-oxetanylmethoxy)propyltrimethoxysilane, to mention a few.

If an alkenyl group, such a group may have preferably 2 to 18, more preferably 2 to 14 and particularly preferred 2 to 12 carbon atoms. The ethylenic, i.e. two carbon atoms bonded with double bond, group is preferably located at the position 2 or higher, related to the Si atom in the molecule. Branched alkenyl is preferably branched at the alpha or beta position with one and more, preferably two, C1 to C6 alkyl, alkenyl or alkynyl groups, optionally fluorinated or per-fluorinated alkyl, alkenyl or alkynyl groups.

If an alkynyl group, it may have preferably 2 to 18, more preferably 2 to 14 and particularly preferred 2 to 12 carbon atoms. The ethylinic group, i.e. two carbon atoms bonded with triple bond, group is preferably located at the position 2 or higher, related to the Si or M atom in the molecule. Branched alkynyl is preferably branched at the alpha or beta position with one and more, preferably two, C1 to C6 alkyl, alkenyl or alkynyl groups, optionally per-fluorinated alkyl, alkenyl or alkynyl groups.

If a thiol group, it may be any organosulfur compound containing carbon-bonded sulfhydryl group. Examples of thiol containing silanes are 3-mercaptopropyltrimethoxysilane and 3-mercaptopropyltriethoxysilane.

The reactive group in the second compound can be an alkoxy group. The alkyl residue of the alkoxy groups can be linear or branched. Preferably, the alkoxy groups are comprised of lower alkoxy groups having 1 to 6 carbon atoms, such as methoxy, ethoxy, propoxy and t-butoxy groups. A particular examples of the second compound is an silane, such as 2-(3,4-Epoxycyclohexyl) ethyltrimethoxysilane, 2-(3,4-epoxycyclohexyl)ethyltriethoxysilane, 3-(Trimethoxysilyl)-propylmethacrylate, 3-(Trimethoxysilyl)propylacrylate, (3-glycidyloxypropyl)trimethoxysilane, or 3-glycidoxypropyltriethoxysilane, 3-methacryloxypropyltrimethoxysilane, 3-acryloxypropyltrimethoxysilane, among others.

A third compound may be provided along with the first and second compounds, to be polymerized therewith. The third compound may have the chemical formula $SiR^9_f R^{10}_g$ where $R^9$ is a reactive group and $f=1$ to 4, and where $R^{10}$ is an alkyl or aryl group and $g=4-f$. One such example is tetramethoxysilane. Other examples include phenylmethyldimethoxysilane, trimethylmethoxysilane, dimethyldimethoxysilanesilane, vinyltrimethoxysilane, allyltrimethoxysilane, methyltrimethoxysilane, methyltriethoxysilane, methyl tripropoxysilane, propylethyltrimethoxysilane, ethyltriethoxysilane, vinyltrimethoxysilane, vinyltriethoxysilane, among others.

Though the polymerization of the first and second compounds can be performed using an acid catalyst, a base catalyst is preferred. The base catalyst used in a base catalyzed polymerization between the first and second compounds can be any suitable basic compound. Examples of these basic compounds are any amines like triethylamine and any barium hydroxide like barium hydroxide, barium hydroxide monohydrate, barium hydroxide octahydrate, among others. Other basic catalysts include magnesium oxide, calcium oxide, barium oxide, ammonia, ammonium perchlorate, sodium hydroxide, potassium hydroxide, imidazone or n-butyl amine. In one particular example the base catalyst is $Ba(OH)_2$. The base catalyst can be provided, relative to the first and second compounds together, at a weight percent of less than 0.5%, or at lower amounts such as at a weight percent of less than 0.1%.

Polymerization can be carried out in melt phase or in liquid medium. The temperature is in the range of about 20 to 200'C, typically about 25 to 160'C, in particular about 40 to 120'C. Generally polymerization is carried out at ambient pressure and the maximum temperature is set by the boiling point of any solvent used. Polymerization can be carried out at refluxing conditions. Other pressures and temperatures are also possible. The molar ratio of the first compound to the second compound can be 95:5 to 5:95, in particular 90:10 to 10:90, preferably 80:20 to 20:80. In a preferred example, the molar ratio of the first compound to the second compound (or second plus other compounds that take part in the polymerization reaction—see below) is at least 40:60, or even 45:55 or higher.

In one example, the first compound has —OH groups as the reactive groups and the second compound has alkoxy groups as the reactive groups. Preferably, the total number of —OH groups for the amount of the first compound added is not more than the total number of reactive groups, e.g. alkoxy groups in the second compound, and preferably less than the total number of reactive groups in the second compound (or in the second compound plus any other compounds added with alkoxy groups, e.g. an added tetramethoxysilane or other third compound involved in the polymerization reaction, ad mentioned herein). With the alkoxy groups outnumbering the hydroxyl groups, all or substantially all of the —OH groups will react and be removed from the siloxane, such as methanol if the alkoxysilane is a methoxysilane, ethanol if the alkoxysilane is ethoxysilane, etc. Though the number of —OH groups in the first compound and the number of the reactive groups in the second compound (preferably other than —OH groups) can be substantially the same, it is preferably that the total number of reactive groups in the second compound outnumber the —OH groups in the first compound by 10% or more, preferably by 25% or more. In some embodiments the number of second compound reactive groups outnumber the first compound —OH groups by 40% or more, or even 60% or more, 75% or more, or as high as 100% or more. The methanol, ethanol or other byproduct of the polymerization reaction depending upon the compounds selected, is removed after polymerization, preferably evaporated out in a drying chamber.

The obtained siloxane polymers have any desired (weight average) molecular weight, such as from 500 to 100,000 g/mol. The molecular weight can be in the lower end of this range (e.g., from 500 to 10,000 g/mol, or more preferably 500 to 8,000 g/mol) or the organosiloxane material can have a molecular weight in the upper end of this range (such as from 10,000 to 100,000 g/mol or more preferably from 15,000 to 50,000 g/mol). It may be desirable to mix a polymer organosiloxane material having a lower molecular weight with an organosiloxane material having a higher molecular weight.

The obtained siloxane polymer may then be combined with additional components depending upon the final desired use of the polymer. Preferably, the siloxane polymer is combined with a filler to form a composition, such as a particulate filler having particles with an average particle size of less than 100 microns, preferably less than 50 microns, including less than 20 microns. Additional components may be part of the composition, such as catalysts or curing agents, one or more coupling agents, dispersants, antioxidants, stabilizers, adhesion promoters, and/or other desired components depending upon the final desired use of the siloxane material. In one example, a reducing agent that can reduce an oxidized surface to its metallic form, is included. A reducing agent can remove oxidation from particles if they are metallic particles with surface oxidation, and/or remove oxidation from e.g metallic bonding pads or other metallic or electrically conductive areas that have oxidized, so as to improve the electrical connection between the siloxane particle material and the surface on which it is deposited or adhered. Reducing or stabilization agents can include ethylene glycol, beta-D-glucose, poly ethylene oxide, glycerol, 1,2-propylene glycol, N,N dimethyl formamide, poly-sodium acyrylate (PSA), betacyclodextrin with polyacyrylic acid, dihydroxy benzene, poly vinyl alcohol, 1,2-propylene glycol, hydrazine, hydrazine sulfate, Sodium borohydride, ascorbic acid, hydroquinone family, gallic acid, pyrogallol, glyoxal, acetaldehyde, glutaraldehyde, aliphatic dialdehyde family, paraformaldehyde, tin powder, zinc powder, formic acid. An additive such as a stabilization agent, e.g. an antioxidant such as Irganox (as mentioned hereinbelow) or a diazine derivative can also be added.

Cross-linking silicon or non-silicon based resins and oligomers can be used to enhance cross linking between siloxane polymers. The functionality of added cross-linking oligomer or resin is chosen by functionality of siloxane polymer. If for example epoxy based alkoxysilanes were used during polymerization of siloxane polymer, then epoxy functional oligomer or resin can be used. The epoxy oligomer or resin can be any di, tri, tetra, or higher functionality epoxy oligomer or resin. Examples of these epoxy oligomers or resins can be 1,1,3,3-tetramethyldisiloxane-1,3-bis2-(3,4-epoxycyclohexyl)ethyl, 1,1,3,3-tetramethyldisiloxane-1,3-bisglycidoxypropyl, Bis(3,4-epoxycyclohexylmethyl) adipate, 3,4-Epoxycyclohexylmethyl 3,4-epoxycyclohexanecarboxylate, 1,4-Cyclohexanedimethanol diglycidyl ether, Bisphenol A diglycidyl ether, Diglycidyl 1,2-cyclohexanedicarboxylate, to mention a few.

The curing agent added to the final formulation is any compound that can initiate and/or accelerate the curing process of functional groups in siloxane polymer. These curing agents can be either heat and/or UV activated. The cross-linking groups in the siloxane polymer, as mentioned above, are preferably epoxide, oxetane, acrylate, alkenyl or alkynyl groups. The curing agent is selected based on the cross-linking group in the siloxane polymer.

In one embodiment, the curing agent for epoxy and oxetane groups can be selected from nitrogen-containing curing agents, such as primary and/or secondary amines which show blocked or decreased activity. The definition "primary or secondary amines which show blocked or decreased reactivity" shall mean those amines which due to a chemical or physical blocking are incapable or only have very low capability to react with the resin components, but may regenerate their reactivity after liberation of the amine, e.g. by melting it at increased temperature, by removing sheath or coatings, by the action of pressure or of supersonic waves or of other energy types, the curing reaction of the resin components starts.

Examples of heat-activatable curing agent include complexes of at least one organoborane or borane with at least one amine. The amine may be of any type that complexes the organoborane and/or borane and that can be decomplexed to free the organoborane or borane when desired. The amine may comprise a variety of structures, for example, any primary or secondary amine or polyamines containing primary and/or secondary amines. The organoborane can be selected from alkyl boranes. An example of these heat particular preferred borane is boron trifluoride. Suitable amine/(organo)borane complexes are available from commercial sources such as King Industries, Air products, and ATO-Tech.

Other heat activated curing agents for epoxy groups are thermal acid generators which can release strong acids at elevated temperature to catalyze cross-linking reactions of epoxy. These thermal acid generators can be for example any onium salts like sulfonium and iodonium salts having complex anion of the type $BF_4^-$, $PF_6^-$, $SbF_6^-$, $CF_3SO_3^-$, and $(C_6F_5)_4B^-$. Commercial examples of these thermal acid generators are K-PURE CXC-1612 and K-PURE CXC-1614 manufactured by King Industries.

Additionally, with respect to epoxy and/or oxetane containing polymers, curing agent, co-curing agents, catalysts, initiators or other additives designed to participate in or promote curing of the adhesive formulation like for example, anhydrides, amines, imidazoles, thiols, carboxylic acids, phenols, dicyandiamide, urea, hydrazine, hydrazide, amino-formaldehyde resins, melamine-formaldehyde resins, quaternary ammonium salts, quaternary phosphonium salts, tri-aryl sulfonium salts, di-aryl iodonium salts, diazonium salts, and the like, can be used.

For acrylate, alkenyl and alkynyl cross linking groups curing agent can be either thermal or UV activated. Examples of thermal activated are peroxides and azo compounds. Peroxide is a compound containing unstable oxygen-oxygen single bond which easily split into reactive radicals via hemolytic cleavage. Azo compounds have R—N=N—R functional group which can decompose to nitrogen gas and two organic radicals. In both of these cases, the radicals can catalyze the polymerization of acrylate, alkenyl and alkynyl bonds. Examples of peroxide and azo compounds are di-tert-butyl peroxide, 2,2-Bis(tert-butylperoxy)butane, tert-Butyl peracetate, 2,5-Di(tert-butylperoxy)-2,5-dimethyl-3-hexyne, Dicumyl peroxide, Benzoyl peroxide, Di-tert-amyl peroxide, tert-Butyl peroxybenzoate, 4,4'-Azobis(4-cyanopentanoic acid), 2,2'-Azobis(2-amidinopropane) dihydrochloride, diphenyldiazene, Diethyl azodicarboxylate and 1,1'-Azobis(cyclohexanecarbonitrile) to mention a few Photoinitiators are compounds that decompose to free radicals when exposed to light and therefore can promote polymerization of acrylate, alkenyl and alkynyl compounds. Commercial examples of these photoinitiators are Irgacure 149, Irgacure 184, Irgacure 369, Irgacure 500, Irgacure 651, Irgacure 784, Irgacure 819, Irgacure 907, Irgacure 1700, Irgacure 1800, Irgacure 1850, Irgacure 2959, Irgacure 1173, Irgacure 4265 manufactured by BASF.

One method to incorporate curing agent to the system is to attach a curing agent or a functional group that can act as curing agent, to a silane monomer. Therefore the curing agent will accelerate curing of the siloxane polymer. Examples of these kind of curing agents attached to a silane monomer are to γ-Imidazolylpropyltriethoxysilane, γ-Imidazolylpropyltrimethoxysilanel, 3-mercaptopropyltrimethoxysilane, 3-mercaptopropyltriethoxysilane, 3-(triethoxysilyl)propylsuccinicanhydride, 3-(trimethoxysilyl)propylsuccinicanhydride, 3-aminopropyltrimethoxysilane and 3-aminopropyltriethoxysilane to mention a few.

An adhesion promoter can be part of the composition and can be any suitable compound that can enhance adhesion between cured product and surface where product has been applied. Most commonly used adhesion promoters are functional silanes where alkoxysilanes and one to three functional groups. Examples of adhesion promoter used in die attach products can be octyltriethoxysilane, mercaptopropyltriethoxysilane, cyanopropyltrimethoxysilane, 2-(3,4-Epoxycyclohexyl)ethyltrimethoxysilane, 2-(3,4-epoxycyclohexyl)ethyltriethoxysilane, 3-(Trimethoxysilyl)propylmethacrylate, 3-(Trimethoxysilyl)propylacrylate, (3-glycidyloxypropyl)trimethoxysilane, or 3-glycidoxypropyltriethoxysilane, 3-methacryloxypropyltrimethoxysilane and 3-acryloxypropyltrimethoxysilane.

The polymerized siloxane formed will have a [Si—O—Si—O]$_n$ repeating backbone (i.e. a backbone of repeating units of formula [Si—O—Si—O]), with organic functional groups thereon depending on the silicon containing starting materials. However it is also possible to achieve a [Si—O—Si—C]$_n$ or even a [Si—O-Me-O]$_n$ (where Me is a metal) backbone. In the formulas, n is an integer of typically 1 to 1,000,000, in particular 1 to 100,000, for example 1 to 10,000, or even 1 to 5,000 or 1 to 1,000.

To obtain a [Si—O—Si—C] backbone, a chemical with formula $R^2_{3-a}R^1_a SiR^{11}SiR^1_b R^2_{3-b}$ can be polymerized together with the first, second, and third compounds or any combination of these, as mentioned above, where a is from 1 to 3, b is from 1 to 3, $R^1$ is a reactive group like explained above, $R^2$ is an alkyl, alkenyl, alkynyl, alcohol, carboxylic acid, dicarboxylic acid, aryl, polyaryl, polycyclic alkyl, hetero cyclic aliphatic, hetero cyclic aromatic group and $R^{11}$ is independently an alkyl group or aryl group, or an oligomer thereof having a molecular weight of less than 1000 g/mol. Examples of these compound are 1,2-bis(dimethylhydroxylsilyl)ethane, 1,2-bis(trimethoxylsilyl)ethane, 1,2-Bis(dimethoxymethylsilyl)ethane, 1,2-Bis(methoxydimethylsilyl) ethane, 1,2-bis(triethoxylsilyl)-ethane, 1,3-bis(dimethylhydroxylsilyl)propane, 1,3-bis(trimethoxylsilyl)propane, 1,3-Bis(dimethoxymethylsilyl)propane, 1,3-Bis(methoxydimethylsilyl) propane, 1,3-bis(triethoxylsilyl)-propane, 1,4-bis(dimethylhydroxylsilyl)butane, 1,4-bis(trimethoxylsilyl)butane, 1,4-Bis(dimethoxymethylsilyl)butane, 1,4-Bis(methoxydimethylsilyl) butane, 1,4-bis(triethoxylsilyl)-butane, 1,5-bis(dimethylhydroxylsilyl)pentane, 1,5-bis(trimethoxylsilyl)pentane, 1,5-Bis(dimethoxymethylsilyl) pentane, 1,5-bis(methoxydimethylsilyl)pentane, 1,5-bis(triethoxylsilyl)pentane, 1,6-bis(dimethylhydroxylsilyl)hexane, 1,6-bis(trimethoxylsilyl)hexane, 1,6-Bis(dimethoxymethylsilyl)hexane, 1,6-Bis(methoxydimethylsilyl) hexane, 1,6-bis(triethoxylsilyl)hexane 1,4-bis(trimethoxylsilyl)benzene, bis(trimethoxylsilyl)naphthalene, bis(trimethoxylsilyl) anthrazene, bis(trimethoxylsilyl)phenanthere, bis(trimethoxylsilyl)-norbornene, 1,4-Bis(dimethylhydroxysilyl) benzene, 1,4-bis(methoxydimethylsilyl)benzene and 1,4-bis(triethoxysilyl)benzene to mention few.

In one embodiment to obtain [Si—O—Si—C] backbone, a compound with formula $R^5_{3-(c+d)}R^4_d R^3_c SiR^{11}SiR^3_e R^4_f R^5_{3-(e+f)}$ is polymerized together with the first, second, third compounds as mentioned herein, or any combinations of these, where $R^3$ is a cross-linking functional group, $R^4$ is a reactive group, and $R^5$ is an alkyl, alkenyl, alkynyl, alcohol, carboxylic acid, dicarboxylic acid, aryl, polyaryl, polycyclic alkyl, hetero cyclic aliphatic, hetero cyclic aromatic group, $R^{12}$ is independently an alkyl group or aryl group, and where c=1 to 2, d=1 to (3−c), e=1 to 2, and f=1 to (3−e), or an oligomer thereof having a molecular weight of less than 1000 g/mol. Examples of these compounds are 1,2-bis(ethenyldimethoxysilyl)ethane, 1,2-bis(ethynyldimethoxysilyl)ethane, 1,2-bis(ethynyldimethoxy)ethane, 1,2-bis(3-glycidoxypropyldimethoxysilyl) ethane, 1,2-bis[2-(3,4-Epoxycyclohexyl) ethyldimethoxysilyl]ethane, 1,2-bis (propylmethacrylatedimethoxysilyl)ethane, 1, 4-bis (ethenyldimethoxysilyl)benzene, 1,4-bis (ethynyldimethoxysilyl)benzene, 1,4-bis (ethynyldimethoxysilyl)benzene, 1,4-bis(3-glycidoxypropyl dimethoxysilyl)benzene, 1,4-bis[2-(3,4-epoxycyclohexyl) ethyldimethoxysilyl]benzene, 1,4-bis(propyl methacrylatedimethoxysilyl)-benzene, to mention few.

In one embodiment a siloxane monomer with molecular formula $R^1_a R^2_b R^3_{3-(a+b)}Si$—O—$SiR^2_2$—O—Si $R^1_a R^2_b R^3_{3-(a+b)}$ where $R^1$ is reactive group like explained above, $R^2$ is alkyl or aryl like explained above, $R^3$ is cross linking functional group like explained above and a=0 to 3, b=0 to 3, is polymerized with previously mentioned silanes or added as an additive to the final formulation. Examples of these compounds are 1,1,5,5-tetramethoxy-1,5-dimethyl-3, 3-diphenyltrisiloxane, 1,1,5,5-tetramethoxy-1,3,3,5-tetraphenyltrisiloxane, 1,1,5,5-tetraethoxy-3,3-diphenyltrisiloxane, 1,1,5,5-tetramethoxy-1,5-divinyl-3,3-diphenyltrisiloxane, 1,1,5,5-tetramethoxy-1,5-dimethyl-3,3-diisopropyltrisiloxane, 1,1,1,5,5,5-hexamethoxy-3,3-diphenyltrisiloxane, 1,5-dimethyl-1,5-diethoxy-3,3-diphenyltrisiloxane, 1,5-bis(mercaptopropyl)-1,1,5,5-tetramethoxy-3,3-diphenyltrisiloxane, 1,5-divinyl-1,1,5,5-tetramethoxy-3-phenyl-3-methyltrisiloxane, 1,5-divinyl-1, 1,5,5-tetramethoxy-3-cyclohexyl-3-methyltrisiloxane, 1,1, 7,7-tetramethoxy-1,7-divinyl-3,3,5,5-tetramethyltetrasiloxane, 1,1,5,5-tetramethoxy-3,3-dimethyltrisiloxane, 1,1,7,7-tetraethoxy-3,3,5,5-tetramethyltetrasiloxane, 1,1,5,5-tetraethoxy-3,3-dimethyltrisiloxane, 1,1,5,5-tetramethoxy-1,5-[2-(3,4-epoxycyclohexyl)ethyl]-3,3-diphenyltrisiloxane, 1,1,5,5-tetramethoxy-1,5-(3-glycidoxypropyl)-3,3-diphenyltrisiloxane, 1,5-dimethyl-1,5-dimethoxy-1,5-[2-(3, 4-epoxycyclohexyl)ethyl]-3,3-diphenyltrisiloxane, 1,5-dimethyl-1,5-dimethoxy-1,5-(3-glycidoxypropyl)-3,3-diphenyltrisiloxane to mention few examples.

An additive added to the composition (after polymerization of the siloxane material as noted above) can be a silane compound with formula of $R^1_a R^2_b SiR^3_{4-(a+b)}$ where $R^1$ is reactive group like hydroxyl, alkoxy or acetyloxy, $R^2$ is alkyl or aryl group, $R^3$ is crosslinking compound like epoxy, oxetane, alkenyl, acrylate or alkynyl group, a=0 to 1 and b=0 to 1. Examples of such additives are tri-(3-glycidoxypropyl) phenylsilane, tri-[2-(3,4-epoxycyclohexyl)ethyl]phenylsilane, tri-(3-methacryloxypropyl)phenylsilane, tri-(3-acryloxypropyl)phenylsilane, tetra-(3-glycidoxypropyl)-silane, tetra-[2-(3,4-epoxycyclohexyl)ethyl]silane, tetra-(3-methacryloxypropyl)silane, tetra-(3-acryloxypropyl)silane, tri-(3-glycidoxypropyl)p-tolylsilane, tri-[2-(3,4-epoxycyclohexyl)ethyl]p-tolylsilane, tri-(3-methacryloxypropyl)p-tolylsilane, tri-(3-acryloxypropyl)p-tolylsilane, tri-(3-glycidoxypropyl)hydroxylsilane, tri-[2-(3,4-epoxycyclohexyl)ethyl]hydroxylsilane, tri-(3-methacryloxypropyl)hydroxylsilane, tri-(3-acryloxypropyl)hydroxylsilane.

The additives can be also any organic or silicone polymers that may react or may not react with the main polymer matrix therefore acting as plasticizer, softener, or matrix modifier like silicone. The additive can be also an inorganic polycondensate such as SiOx, TiOx, AlOx, TaOx, HfOx, ZrOx, SnOx, polysilazane.

The particulate filler may be a conductive material, such as carbon black, graphite, graphene, gold, silver, copper, platinum, palladium, nickel, aluminum, silver plated copper, silver plated aluminum, bismuth, tin, bismuth-tin alloy, silver plated fiber, nickel plate copper, silver and nickel plated copper, gold plated copper, gold and nickel plated copper, or it may be gold, silver-gold, silver, nickel, tin, platinum, titanium plated polymer such as polyacrylate, polystyrene or silicone but not limited to these. The filler can be also a semiconductor material such as silicon, n or p type doped silicon, GaN, InGaN, GaAs, InP, SiC but not limited to these. Furthermore, the filler can be quantum dot or a surface plasmonic particle or phosphor particle. Other semiconductor particles or quantum dots, such as Ge, GaP, InAs, CdSe, ZnO, ZnSe, TiO2, ZnS, CdS, CdTe, etc. are also possible.

The filler can be particles that are any suitable metal or semi-metal particles such as those selected from gold, silver, copper, platinum, palladium, indium, iron, nickel, aluminum, carbon, cobalt, strontium, zinc, molybdenum, titanium, tungsten, silver plated copper, silver plated aluminum, bismuth, tin, bismuth-tin alloy, silver plated fiber or alloys or combinations of these. Metal particles that are transition metal particles (whether early transition metals or late transition metals) are envisioned, as are semi metals and metalloids. Semi-metal or metalloid particles such as arsenic, antimony, tellurium, germanium, silicon, and bismuth are envisioned.

Or alternatively it may be an electrically nonconductive material, such as silica, quartz, alumina, aluminum nitride, aluminum nitride coated with silica, barium sulfate, alumina trihydrate, boron nitride, etc. The fillers can be the form of particles or flakes, and can be micro-sized or nano-sized. The filler may comprise ceramic compound particles that are nitrides, oxynitrides, carbides, and oxycarbides of metals or semimetals are possible. In particular, the filler can be particles that are ceramic particles that are an oxide of silicon, zinc, aluminum, yttrium, ytterbium, tungsten, titanium silicon, titanium, antimony, samarium, nickel, nickel cobalt, molybdenum, magnesium, manganese, lanthanide, iron, indium tin, copper, cobalt aluminum, chromium, cesium or calcium.

Also possible are particles that comprise carbon and are selected from carbon black, graphite, graphene, diamond, silicon carbonitride, titanium carbonitride, carbon nanobuds and carbon nanotubes. The particles of the filler can be carbide particles, such as iron carbide, silicon carbide, cobalt carbide, tungsten carbide, boron carbide, zirconium carbide, chromium carbide, titanium carbide, or molybdenum carbide. The particles could instead be nitride particles, such as aluminum nitride, tantalum nitride, boron nitride, titanium nitride, copper nitride, molybdenum nitride, tungsten nitride, iron nitride, silicon nitride, indium nitride, gallium nitride or carbon nitride.

Particles of any suitable size can be used, depending upon the final application. In many cases small particles having an average particle size of less than 100 microns, and preferably less than 50 or even 20 microns are used. Sub-micron particles, such as those less than 1 micron, or e.g. from 1 to 500 nm, such as less than 200 nm, such as from 1 to 100 nm, or even less than 10 nm, are also envisioned. In other examples, particles are provided that have an average particle size of from 5 to 50 nm, or from 15 to 75 nm, under 100 nm, or from 50 to 500 nm. Particles that are not elongated, e.g. substantial spherical or square, or flakes with a flattened disc shaped appearance (with smooth edges or rough edges) are possible, as are elongated whiskers, cylinders, wires and other elongated particles, such as those having an aspect ratio of 5:1 or more, or 10:1 or more. Very elongated particles, such as nanowires and nanotubes having a very high aspect ratio are also possible. High aspect ratios for nanowires or nanotubes can be at 25:1 or more, 50:1 or more, or even 100:1 or more. The average particle size for nanowires or nanotubes is in reference to the smallest dimension (width or diameter) as the length can be quite long, even up to centimeters long. As used herein, the term "average particle size" refers to the D50 value of the cumulative volume distribution curve at which 50% by volume of the particles have a diameter less than that value.

The particles can be a mixture of particles as mentioned elsewhere herein, where a first group of particles having an average particle size of greater than 200 nm are provided together with a second group of particles that have an average particle size of less than 200 nm, e.g. where the first group has an average particle size of greater than 500 nm and the second group has an average particle size of less than 100 nm (e.g. average particle size of first group greater than 1 micron, particle size of second group less than 50 nm, or even less than 25 nm). The smaller particles have a lower melting point than the larger particles and melt or sinter at a temperature less than particles or mass of the same material having a plus micron size. In one example, the smaller particles have an average particle size of less than 1 micron and melt or sinter at a temperature less than the bulk temperature of the same material. Depending upon the particle material selected, and the average particle size, the melting and sintering temperatures will be different.

As one example, very small silver nanoparticles can melt at less than 120° C., and sinter at even lower temperatures. As such, if desired, the smaller particles can have a melting or sintering temperature equal to or lower than the polymer curing temperature, so as to form a web of melted or sintered particles connecting the larger particles together prior to full cross-linking and curing of the siloxane polymeric material. In one example, the smaller particles are melted or sintered with the larger particles at a temperature of less than 130° C., e.g. less than 120° C., or even sintered at less than 110° C., whereas the siloxane material undergoes substantial cross-linking at a higher temperature, e.g. substantial sintering or melting at less than 110° C., but substantial polymerization at greater than 110° C. (or e.g. substantial sintering or melting at less than 120° C. (or 130° C.), but substantial polymerization at greater than 120° C. (or 130° C.). The sintering or melting of the smaller particles prior to substantial polymerization of the siloxane material, allows for greater interconnectivity of a formed metal "lattice" which increases the final electrical conductivity of the cured layer. Substantial polymerization prior to substantial sintering or melting of the smaller particles decreases the amount of formed metal "lattice" and lowers the electrical conductivity of the final cured layer. Of course, it is also possible to provide only the particles of the smaller average particle size, e.g. sub micron size, which can still achieve the benefits of lower sintering and melting points as compared to the same bulk material (or the same particles having an average particle size of greater than 1 micron for example).

To enhance the coupling with filler and siloxane polymer, a coupling agent can be used. This coupling agent will increase the adhesion between filler and polymer and therefore can increase thermal and/or electrical conductivity of the final product. The coupling agent can be any silane monomer with a formula of $R^{13}{}_hR^{14}{}_iSiR^{15}{}_j$ where $R^{13}$ is a reactive group like halogen, hydroxyl, alkoxy, acetyl or acetyloxy, R14 is alkyl or aryl group and $R^{15}$ is a functional group including like epoxy, anhydride, cyano, oxetane, amine, thiol, allyl, alkenyl or alkynyl, h=0 to 4, I=0 to 4, j=0 to 4 and h+i+j=4. The coupling agent can be either mixed directly with filler, siloxane polymer, curing agent, and additives when final product is prepared or the filler particles can be treated by the coupling agent before they are mixed with particles.

If the particles are treated with coupling agent before using them in the final formulation, different methods like deposition from alcohol solution, deposition from aqueous solution, bulk deposition onto filler and anhydrous liquid phase deposition can be used. In the deposition from alcohol solution, alcohol/water solution is prepared and the solution pH is adjusted to slightly acidic (pH 4.5-5.5). Silane is added to this solution and mixed for few minutes to allow partly hydrolyzing. Then filler particles are added and the solution is mixed from to RT to refluxing temperature for different time periods. After mixing, the particles are filtered, rinsed with ethanol and dried in an oven to obtain surface treated particles by the coupling agent. Deposition from aqueous solution is similar compared to deposition from alcohol solution but instead of alcohol, pure water is used as a solvent. pH is again adjusted by acid if non amine functionalized is used. After mixing particles with water/silane mixture, the particles are filtered, rinsed and dried. Bulk deposition method is a method where silane coupling agent is mixed with solvent without any water or pH adjustment. The filler particles are coated with the silane alcohol solution using different methods like spray coating and then dried in an oven.

In the anhydrous liquid phase deposition, silane are mixed with organic solvent like toluene, tetrahydrofuran or hydrocarbon and filler particles are refluxed in this solution and the extra solvent is removed by vacuum or filtering. The particles can be also dried afterwards in an oven but it is not sometimes need due to direct reaction between particles and filler under refluxing conditions.

Examples of such silane coupling agents are bis (2-hydroxyethyl)-3-aminopropyltriethoxysilane, Allyltrimethoxysilane, N-(2-Aminoethyl)-3-aminopropylmethyldimethoxysilane, N-(2-Aminoethyl)-3-aminopropyltrimethoxysilane, 3-Aminopropylmethyldiethoxysilane. 3-Aminopropyltriethoxysilane, 3-Aminopropyltrimethoxysilane, (N-Trimethoxysilylpropyl)polyethyleneimine, Trimethoxysilylpropyldiethylenetriamine, Phenyltriethoxysilane, Phenyltrimethoxysilane, 3-Chloropropyltrimethoxysilane, 1-Trimethoxysilyl-2(p,m-chloromethyl)phenylethane, 2-(3,4-Epoxycyclohexyl)ethyltrimethoxysilane, 3-Glycidoxypropyltrimethoxysilane, Isocyanatepropyl-triethoxysilane, Bis[3-(triethoxysilyl)propyl]tetrasulfide, 3-Mercaptopropyl-methyldimethoxysilane, 3-Mercaptopropyltrimethoxysilane, 3-Methacryloxypropyltrimethoxysilane, 2-(Diphenylphosphino)ethyltriethoxysilane, 1,3-Divinyltetramethyldisilazane, Hexamethyldisilazane, 3-(N-Styrylmethyl-2-aminoethylamino)propyltrimethoxysilane, N-(Triethoxysilylpropyl)urea, 1,3-Divinyltetramethyldisilazane, Vinyltriethoxysilane and Vinyltrimethoxysilane to mention a few.

Depending on the type of particles added, the siloxane-particle cured final product can be a layer or film that is thermally conductive, such as having a thermal conductivity, after final heat or UV curing, of greater than 0.5 watts per meter kelvin (W/(m·K)). Higher thermal conductivity materials are possible, depending upon the type of particles selected. Metal particles in the siloxane composition can result in a cured final film having a thermal conductivity greater than 2.0 W/(m·K), such as greater than 4.0 W/(m·K), or even greater than 10.0 W/(m·K). Depending upon the final application, much higher thermal conductivity may be desired, such as greater than 50.0 W/(m·K), or even greater than 100.0 W/(m·K). However in other applications, particles may be selected to result, if desired, in a material having low thermal conductivity.

The final cured product can have low electrical resistivity, such as a sheet resistance of the deposited thin film of preferably less than 200 Ω/square, more preferably less than 100 Ω/square, such as less than 50 Ω/square. However a number of desired final uses of the material may have high electrical resistivity, as mentioned herein.

In some cases, particularly if the composition will be applied in a device that requires optical characteristics, though it may be desirable in some cases for the final cured siloxane to have optically absorbing properties, it is more likely that the material would desirably be highly transmissive to light in the visible spectrum (or in the spectrum in which the final device is operated), or would desirably be highly reflective to light in the visible spectrum (or in the spectrum in which the device is to be operated). As an example of a transparent material, the final cured layer having a thickness of from 1 to 50 microns will transmit at least 85% of the visible light incident perpendicularly thereto, or preferably transmit at least 90%, more preferably at least 92.5% and most preferably at least 95% As an example of a reflective layer, the final cured layer can reflect at least 85% of the light incident thereon, preferably reflect at least 95% of the light incident thereon at an angle of 90 degrees.

The material of the present invention may also contain a stabilizer and/or an antioxidant. These compounds are added to protect the material from degradation caused by reaction with oxygen induced by such things as heat, light, or residual catalyst from the raw materials.

Among the applicable stabilizers or antioxidants included herein are high molecular weight hindered phenols and multifunctional phenols such as sulfur and phosphorous-containing phenol. Hindered phenols are well known to those skilled in the art and may be characterized as phenolic compounds which also contain sterically bulky radicals in close proximity to the phenolic hydroxyl group thereof. In particular, tertiary butyl groups generally are substituted onto the benzene ring in at least one of the ortho positions relative to the phenolic hydroxyl group. The presence of these sterically bulky substituted radicals in the vicinity of the hydroxyl group serves to retard its stretching frequency, and correspondingly, its reactivity; this hindrance thus providing the phenolic compound with its stabilizing properties. Representative hindered phenols include; 1,3,5-trimethyl-2,4,6-tris-(3,5-di-tert-butyl-4-hydroxybenzyl)-benzene; pentaerythrityl tetrakis-3(3,5-di-tert-butyl-4-hydroxyphenyl)-propionate; n-octadecyl-3(3,5-di-tert-butyl-4-hydroxyphenyl)-propionate; 4,4'-methylenebis(2,6-tert-butyl-phenol); 4,4'-thiobis(6-tert-butyl-o-cresol); 2,6-di-tertbutylphenol; 6-(4-hydroxyphenoxy)-2,4-bis(n-octyl-thio)-1,3,5 triazine; di-n-octylthio)ethyl 3,5-di-tert-butyl-4-hydroxy-benzoate; and sorbitol hexa[3-(3,5-d i-tert-butyl-4-hydroxy-phenyl)-propionate]. Commercial examples of antioxidant are for example Irganox 1035, Irganox 1010, Irganox 1076, Irganox 1098, Irganox 3114, Irganox PS800, Irganox PS802, Irgafos 168 manufactured by BASF.

The weight ratio between siloxane polymer and filler is between 100:0 to 5:95 depending of the final use of the product. The ratio between siloxane polymer and cross-linking silicon or non-silicon based resin or oligomer is between 100:0 to 75:25. The amount of curing agent calculated from siloxane polymer amount is from 0.1 to 20%. The amount of adhesion promoter based on total amount of formulation is from 0 to 10%. The amount of antioxidant based on total weight of the formulation is from 0 to 5%.

The siloxane-particle composition can be used in a variety of areas. It can be used as an adhesive or encapsulant in electronics or optoelectronics packaging, LED and OLED front and back end processing, 3D, photovoltaic and display metallization, in place of soldering e.g. solder bumps in semiconductor packaging, printed electronics, OLED low work function cathode ink, ITO replacement ink, metal mesh and other electrodes, high resolution photovoltaic paste, LMO cathode paste, photovoltaics, power electronics and EMI, touch sensor and other displays, heat or UV curable encapsulants or dielectrics, to name a few.

Depending upon the type of curing mechanism and catalyst activation the final formulation is cured usually by heating the material to higher temperature. For example if thermal acid generator is used, the material is placed in oven for specific time period. Also possible is curing with electromagnetic radiation, such as UV light.

The molecular weight of the siloxane polymer formed from polymerization of the first and second compounds is from about 300 to 10,000 g/mol, preferably from about 400 to 5000 g/mol, and more preferably from about 500 to 2000 g/mol. The polymer is combined with particles of any desired size, preferably having an average particle size of less than 100 microns, more preferably less than 50 microns, or even less than 20 microns. The siloxane polymer is added at a weight percent of from 10 to 90%, and the particles are added at a weight percent of from 1 to 90%. If the final use of the siloxane material requires optical transparency, the particles may be ceramic particles added at a lower weight percent, such as from 1 to 20% by weight. If the siloxane material is to be used where electrical conductivity is desired, such as in a semiconductor package, the particles may be metal particles added at from 60 to 95% by weight.

Polymerization of the first and second compounds is performed, and the particles mixed therewith, to form a viscous fluid having a viscosity of from 50 to 100000 mPa-sec, preferably from 1000 to 75000 mPa-sec, and more preferably from 5000 to 50000 mPa-sec. The viscosity can be measured with a viscometer, such as a Brookfield or Cole-Parmer viscometer, which rotates a disc or cylinder in a fluid sample and measures the torque needed to overcome the viscous resistance to the induced movement. The rotation can be at any desired rate, such as from 1 to 30 rpm, preferably at 5 rpm, and preferably with the material being measured being at 25 C.

After polymerization, any additional desired components can be added to the composition, such as particles, coupling agents, curing agents, etc. The composition is shipped to customers as a viscous material in a container, which may be shipped at ambient temperature without the need for cooling or freezing. As a final product, the material can be applied in the variety of uses mentioned above, typically being heat or UV cured to form a solid cured polymeric siloxane layer.

The composition as disclosed herein is preferably without any substantial solvent. A solvent may be temporarily added, such as to mix a curing agent or other additive with the polymerized viscous material. In such a case, the e.g. curing agent is mixed with a solvent to form a fluid material that can then be mixed with the viscous siloxane polymer. However, as a substantially solvent free composition is desired for shipping to customers, and later application on a customer's device, the solvent that has been temporarily added is removed in a drying chamber. There may however be trace amounts of solvent remaining that were not able to be removed during the drying process, though the composition is substantially free of solvent. This solvent removal aids in the deposition of the composition disclosed herein, by reducing shrinkage during the final curing process, as well as minimizing shrinkage over time during the lifetime of the device, as well as aiding thermal stability of the material during the lifetime of the device.

Knowing the final application of the composition, the desired viscosity of the composition, and the particles to be included, it is possible to fine tune the siloxane polymer (starting compounds, molecular weight, viscosity, etc.) such that, upon incorporation into the composition having particles and other components, the desired final properties are achieved for subsequent delivery to the customer. Due to the stability of the composition, it is possible to ship the composition at ambient temperature without any substantial change in molecular weight or viscosity, even after a one week, or even one month, time period from making till final use by the customer.

EXAMPLES

The following siloxane polymer examples are given by way of illustration and are not intended to be limitative The viscosity of siloxane polymer was measured by Brookfield viscometer (spindle 14). The molecular weight of the polymer was measured by Agilent GPC.

Siloxane polymer i: A 500 mL round bottom flask with stirring bar and reflux condenser was charged with diphenylsilanediol (60 g, 45 mol %), 2-(3,4-Epoxycyclohexyl)ethyl]trimethoxysilane (55.678 g 36.7 mol %) and tetramethoxysilane (17.208 g 18.3 mol %). The flask was heated to 80° C. under nitrogen atmosphere and 0.08 g of barium hydroxide monohydrate dissolved in 1 mL of methanol was added dropwise to the mixture of silanes. The silane mixture was stirred at 80° C. for 30 min during the diphenylsilanediol reacted with alkoxysilanes. After 30 min, formed methanol was evaporated off under vacuum. The siloxane polymer had viscosity of 1000 mPas and Mw of 1100.

Siloxane polymer ii: A 250 mL round bottom flask with stirring bar and reflux condenser was charged with diphenylsilanediol (30 g, 45 mol %), 2-(3,4-Epoxycyclohexyl)ethyl]trimethoxysilane (28.1 g, 37 mol %) and dimethyldimethoxysilane (6.67 g, 18 mol %). The flask was heated to 80° C. under nitrogen atmosphere and 0.035 g of barium hydroxide monohydrate dissolved in 1 mL of methanol was added dropwise to the mixture of silanes. The silane mixture was stirred at 80 C for 30 min during the diphenylsilanediol reacted with alkoxysilanes. After 30 min, formed methanol was evaporated under vacuum. The siloxane polymer had viscosity of 2750 mPas and Mw of 896.

Siloxane polymer iii: A 250 mL round bottom flask with stirring bar and reflux condenser was charged with diphenylsilanediol (24.5 g, 50 mol %), 2-(3,4-Epoxycyclohexyl)ethyl]trimethoxysilane (18.648 g 33.4 mol %) and tetramethoxysilane (5.75 g, 16.7 mol %). The flask was heated to 80° C. under nitrogen atmosphere and 0.026 g of barium hydroxide monohydrate dissolved in 1 mL of methanol was added dropwise to the mixture of silanes. The silane mixture was stirred at 80° C. for 30 min during the diphenylsilanediol reacted with alkoxysilanes. After 30 min, formed methanol was evaporated under vacuum. The siloxane polymer had viscosity of 7313 mPas and Mw of 1328.

Siloxane polymer iv: A 250 mL round bottom flask with stirring bar and reflux condenser was charged with diphenylsilanediol (15 g, 50 mol %), 2-(3,4-Epoxycyclohexyl)ethyl]trimethoxysilane (13.29 g 38.9 mol %) and bis(trimethoxysilyl)ethane (4.17 g 11.1 mol %). The flask was heated to 80° C. under nitrogen atmosphere and 0.0175 g of barium hydroxide monohydrate dissolved in 1 mL of methanol was added dropwise to the mixture of silanes. The silane mixture was stirred at 80° C. for 30 min during the diphenylsilanediol reacted with alkoxysilanes. After 30 min, formed methanol was evaporated under vacuum. The siloxane polymer had viscosity of 1788 mPas and Mw of 1590.

Siloxane polymer v: A 250 mL round bottom flask with stirring bar and reflux condenser was charged with diphenylsilanediol (15 g, 45 mol %), 2-(3,4-Epoxycyclohexyl) ethyl]trimethoxysilane (13.29 g 35 mol %) and vinyltrimethoxysilane (4.57 g 20 mol %). The flask was heated to 80° C. under nitrogen atmosphere and 0.018 g of barium hydroxide monohydrate dissolved in 1 mL of methanol was added dropwise to the mixture of silanes. The silane mixture was stirred at 80° C. for 30 min during the diphenylsilanediol reacted with alkoxysilanes. After 30 min, formed methanol was evaporated off under vacuum. The siloxane polymer had viscosity of 1087 mPas and Mw of 1004.

Siloxane polymer vi: A 250 mL round bottom flask with stirring bar and reflux condenser was charged with di-isopropylsilanediol (20.05 g, 55.55 mol %), 2-(3,4-Epoxycyclohexyl)-ethyl]trimethoxysilane (20.0 g 33.33 mol %) and bis(trimethoxysilyl)ethane (7.3 g 11.11 mol %). The flask was heated to 80° C. under nitrogen atmosphere and 0.025 g of barium hydroxide monohydrate dissolved in 1 mL of methanol was added dropwise to the mixture of silanes. The silane mixture was stirred at 80° C. for 30 min during the diphenylsilanediol reacted with alkoxysilanes. After 30 min, formed methanol was evaporated off under vacuum. The siloxane polymer had viscosity of 150 mPas and Mw of 781.

Siloxane polymer vii: A 250 mL round bottom flask with stirring bar and reflux condenser was charged with di-isobutylsilanediol (18.6 g, 60 mol %) and 2-(3,4-Epoxycyclohexyl)ethyl]-trimethoxysilane (17.32 g, 40 mol %). The flask was heated to 80° C. under nitrogen atmosphere and 0.019 g of barium hydroxide monohydrate dissolved in 1 mL of methanol was added dropwise to the mixture of silanes. The silane mixture was stirred at 80° C. for 30 min during the diphenylsilanediol reacted with alkoxysilanes. After 30 min, formed methanol was evaporated off under vacuum. The siloxane polymer had viscosity of 75 mPas and Mw of 710.

Composition Examples

The following composition examples are given by way of illustration and are not intended to be limitative.

Comp. example 1, Silver filled adhesive: A siloxane polymer with epoxy as a crosslinking functional group (18.3 g, 18.3%), silver flake with average size (D50) of 4 micrometer (81 g, 81%), 3-methacrylatepropyltrimethoxysilane (0.5 g, 0.5%) and King Industries K-PURE CXC-1612 thermal acid generator (0.2%) where mixed together using high shear mixer. The composition has a viscosity of 15000 mPas.

Comp. example 2, Alumina filled adhesive: A siloxane polymer with epoxy as a crosslinking functional group (44.55, 44.45%), aluminium oxide with average size ($D_{50}$) of 0.9 micrometer (53 g, 53%), 3-methacrylatepropyltrimethoxysilane (1 g, 1%), Irganox 1173 (1 g, 1%) and King Industries K-PURE CXC-1612 thermal acid generator (0.45 g, 0.45%) where mixed together using three roll mill. The composition has a viscosity of 20000 mPas.

Comp. example 3, BN filled adhesive: A siloxane polymer with epoxy as a crosslinking functional group (60 g, 60%), boron nitride platelet with average size (D50) of 15 micrometer (35 g, 35%), Irganox 1173 (1.3 g, 1.3%), 2-(3,4-Epoxycyclohexyl)ethyltrimethoxysilane (3.4 g, 3.4%) and King Industries K-PURE CXC-1612 thermal acid generator (0.3 g, 0.3%) where mixed together using three roll mill. The composition has a viscosity of 25000 mPas.

Comp. example 4, Translucent material: A siloxane polymer with methacrylate as a functional group (89 g, 89%), fumed silica with average size (D50) of 0.007 micrometer (5 g, 5%), Irganox 1173 (2 g, 2%) and Irgacure 917 photoinitiator (4 g, 4%) where mixed together using three roll mill. The composition has a viscosity of 25000 mPas.

Comp. example 5, transparent material: Diphenylsilanediol (20.0 g, 92 mmol), 9-phenanthrenyl trimethoxysilane (16.6 g, 56 mmol), 3-methacryloxypropyltrimethoxysilane (9.2 g, 37 mmol) and BaO (25 mg) in methanol were placed in a 100 mL flask and refluxed for 1 hour. The volatiles were evaporated under reduced pressure. Clear polymer resin (37 g) was obtained.

Comp. example 6, high refractive index material: 8.6 g polymer resin having a high index of refraction, prepared as described in Example X1, was blended with 5.7 g $ZrO_2$ nanoparticle solution in 1,2-propanediol monomethyl ether acetate (PGMEA) having a solid content of 50%. 0.26 g photoinitiator (Darocur 1173 by BASF), 0.4 g of oligomeric 3-methacryloxypropyl-trimethoxysilane as an adhesion promoter, and 20 mg surfactant (BYK-307 by BYK Chemie) were added to the solution.

The obtained material was spin-coated on a 100 mm silicon wafer at 2000 rpm. The film was baked at 80° C. 5 min on a hot plate and UV-cured with dose of 3000 mJ/cm2. The refractive index was adjusted by altering the weight ratio of polymer resin and the ZrO2 nanoparticle.

TABLE

| Sample | Weight ratio | Refractive index (at 633 nm) | Refractive index (at 450 nm) | Transmittance (%, ca. 30 μm film; at 450 nm) |
|---|---|---|---|---|
| 1. Resin: ZrO2 | 1:0 | 1.61 | 1.64 | 98.6 |
| 2. Resin: ZrO2 | 3:1 | 1.63 | 1.66 | 98.3 |
| 3. Resin: ZrO2 | 1:1 | 1.67 | 1.70 | 97.5 |
| 4. Resin: ZrO2 | 1:3 | 1.72 | 1.75 | 96.1 |

If desired, the refractive index can be selected based on the siloxane particle material chosen. An index of refraction of from 1.20 to 2.0 can be provided, e.g. from 1.4 to 1.7, or other desired number (1.5 to 1.9, 1.25 to 1.45, etc.), with the index of refraction being measured at 632.8 nm wavelength). Higher refractive indices, e.g. those higher than glass such as from 1.6 to 2.0, can be achieved by providing a metal containing monomer to be polymerized into the siloxane polymer. As mentioned above, it is possible to achieve a $[Si—O-Me-O]_n$ (where Me is a metal) backbone and n has preferably the same meaning as above. Metal containing monomers, with metals such as titanium, tantalum, aluminum, zirconium, hafnium or selenium, among others, can help to increase the index of refraction. Such metal containing monomers can be used in place of the first, second or third compounds as mentioned hereinabove, or as an addition thereto.

Also, it is possible to increase the index of refraction based on the selection of particles (alternatively or in addition to the incorporation of metal into the siloxane polymer as mentioned above). Particular oxide particles, such as oxides of titanium, tantalum, aluminum, zirconium, hafnium or selenium, among others, can help to increase the refractive index. In addition, a coupling agent that improves the incorporation of the particles into the siloxane polymer can be selected to aid in the increase of the refractive index. As one example, a coupling agent having the chemical formula $(R^{16}Ar)_iSiR^1_j$ where i=1 or 2, and j=4–1, where $R_{16}$ is a functional cross linking group that undergoes cross linking with the siloxane polymer upon the application of heat or UV light, where Ar is an aryl group, and where $R_1$ is a reactive group, such as a hydroxyl, halogen, alkoxy, carboxyl, amine or acyloxy group. As such the compound comprises a silicon atom bonded to one or two aryl groups (which aryl groups have a cross-linking substitutent) and where the silicon atom is also bonded to two or three reactive groups, preferably alkoxy groups. The aryl group can be phenyl, naphthalene, phenanthrene, anthracene, etc and the $R_{16}$ functional cross-linking group can be epoxy, acrylate, vinyl, allyl, acetylene, alcohol, amine, thiol, silanol, etc. The coupling agent may also be selected to have a metal atom, such as titanium, tantalum, aluminum, zirconium, hafnium or selenium etc in place of silicon.

Figure 9:
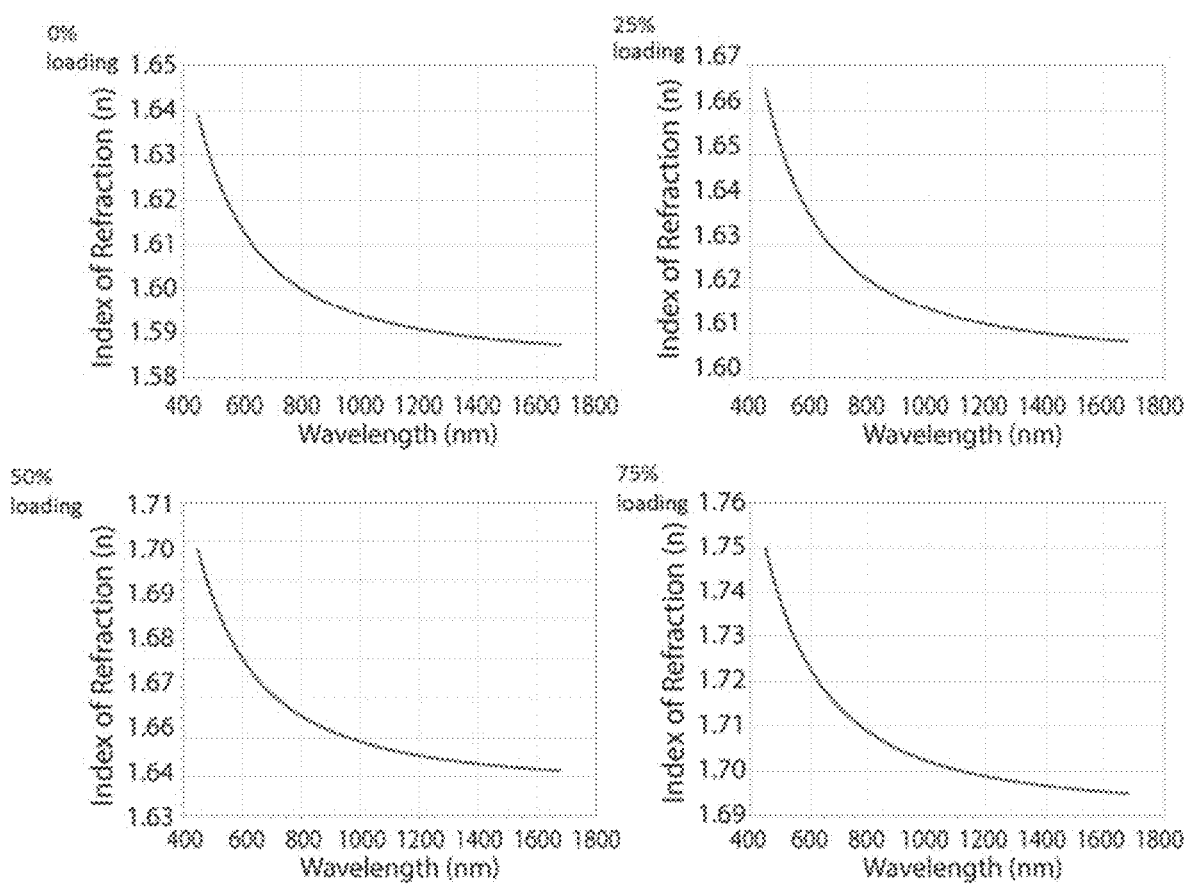
FIG. 9 shows graphs of refractive index vs wavelength for different particle loadings.
Figure 10:
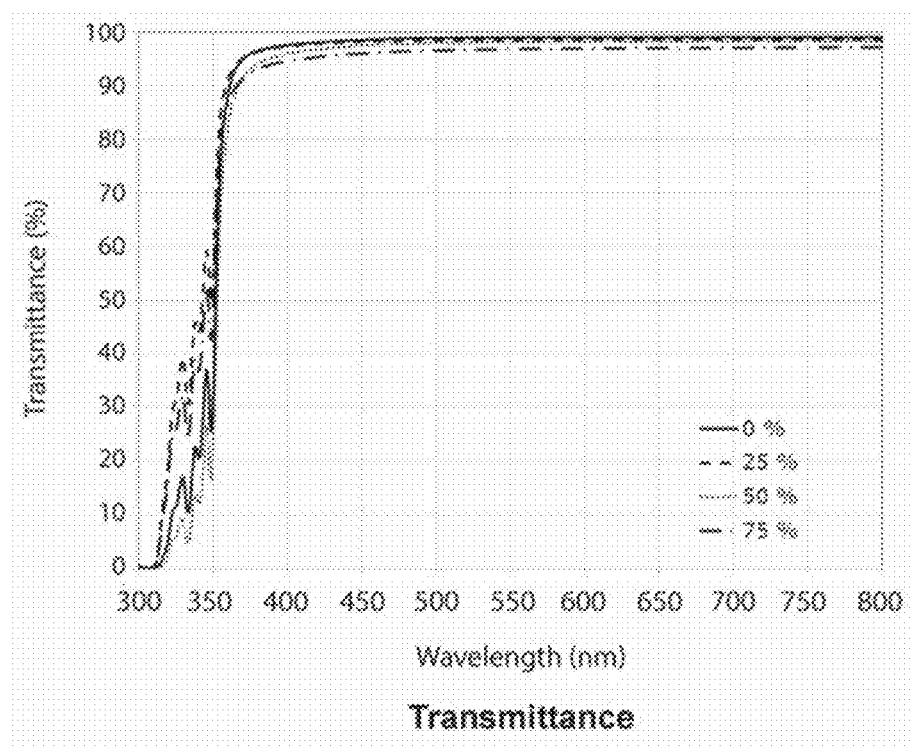
FIG. 10 is a graph of the transmittance vs particle loading.

As can be seen in FIG. 9, the index of refraction of the cured siloxane particle material as disclosed herein is plotted vs wavelength of light, and with each graph having a different amount of particles as part of the siloxane material—from no particles added to the composition, to 75% loading. As can be seen in FIG. 9, an index of refraction of 1.60 or more in the visible spectrum can be achieved with no particles, and an index of refraction in the visible spectrum of 1.70 or more can be achieved with particles in this example. As can be seen in FIG. 10, the % transmittance of the siloxane material is plotted vs. wavelength of light. As illustrated in this figure, different loadings of particles, from no particles to 75% are plotted and in the visible spectrum have a % transmittance of visible light of greater than 90% (in fact greater than 95%). As such, the siloxane material even loaded with a high % of particles, is very transparent and useful in a variety of optical applications.

In view of the disclosed methods and materials, a stable composition is formed. The composition may have one part that is a siloxane polymer having a [—Si—O—Si—O] repeating backbone, with alkyl or aryl groups thereon, and functional cross-linking groups thereon, and another part that is particles mixed with the siloxane material, wherein the particles have an average particle size of less than 100 microns, the particles being any suitable particles such as metal, semi-metal, semiconductor or ceramic particles. The composition as shipped to customers may have a molecular weight of from 300 to 10,000 g/mol, and a viscosity of from 1000 to 75000 mPa-sec at 5 rpm viscometer.

The viscous (or liquid) siloxane polymer is substantially free of —OH groups, thus providing increased shelf-life, and allowing for storing or shipping at ambient temperature if desired. Preferably, the siloxane material has no —OH peak detectable from FTIR analysis thereof. The increased stability of the formed siloxane material allows for storage prior to use where there is a minimal increase in viscosity (cross-linking) during storage, such as less than 25% over the period of 2 weeks, preferably less than 15%, and more preferably less than 10% over a 2 week period stored at room temperature. And, the storage, shipping and later application by the customer can be all performed in the absence of a solvent (except for possible trace residues that remain after drying to remove the solvent), avoiding the problems of solvent capture in the layer later formed in the final product, shrinkage during polymerization, mass loss over time during device usage, etc. No substantial cross-linking occurs during shipping and storage, without the application of heat preferably greater than 100 C or UV light.

Figure 11:
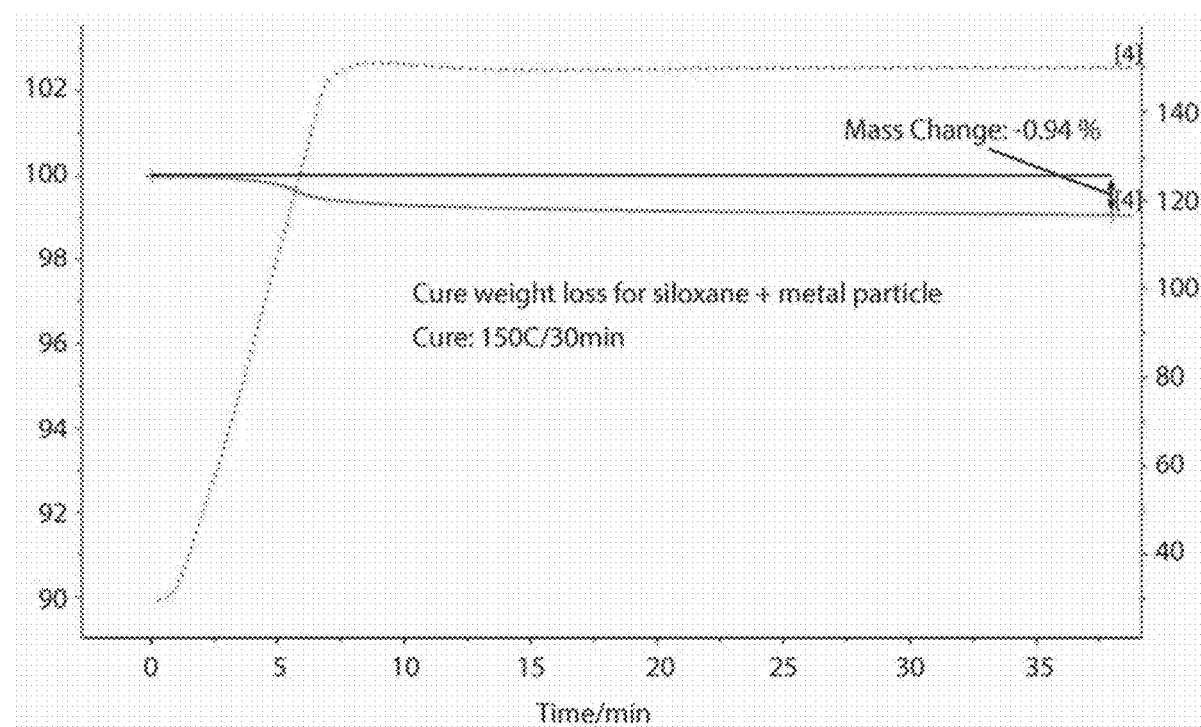
FIG. 11 illustrates mass change of the siloxane polymer during heat induced polymerization.

When the composition is deposited and polymerized, e.g. by the application of heat or UV light, very small shrinkage or reduction in mass is observed. In FIG. 11, the x-axis is time (in minutes), the left y axis is the mass of the layer in terms of % of the starting mass, and the right y-axis is temperature in Celsius. As can be seen in FIG. 11, a siloxane particle mixture as disclosed herein is heated rapidly to 150° C., then held at 150° C. for approximately 30 minutes. In this example, the siloxane particle has a Si—O backbone with phenyl group and epoxy groups, and the particles are silver particles. The mass loss is less than 1% after heat curing for over this time period. Desirably the mass loss is typically less than 4%, and generally less than 2%—however in many cases the difference in mass of the siloxane particle composition between before and after curing is less than 1%. The curing temperature is generally at less than 175° C., though higher curing temperatures are possible. Typically the curing temperature will be at 160° C. or below, more typically at 150° C. or below. However lower curing temperatures are possible, such as at 125° C. or below.

Figure 12:
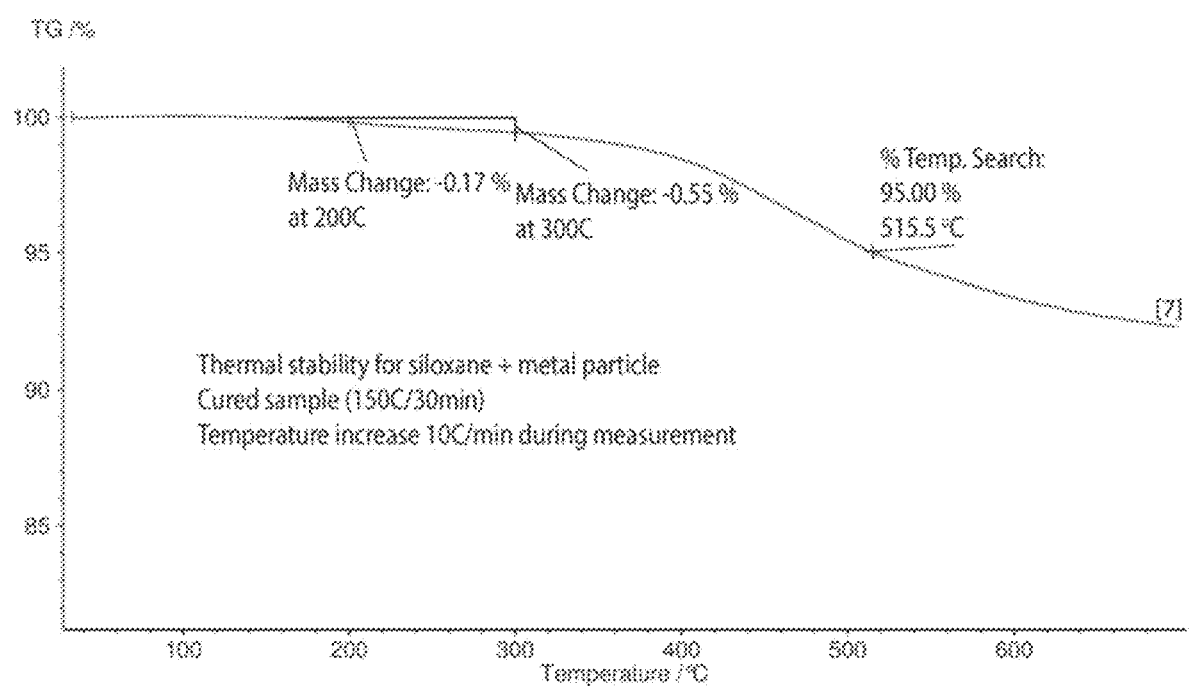
FIG. 12 illustrates the thermal stability of the siloxane material after deposition and polymerization.

As can be seen in FIG. 12, regardless of whether the composition disclosed above is used as an adhesive, as a thermally conductive layer, as an encapsulant, as a patterned electrically conductive layer, a patterned dielectric layer, a transparent layer, a light reflecting layer, etc., once the composition is deposited and polymerized and hardened as desired, the siloxane particle layer or mass is thermally very stable. As an example, heating the in situ material after hardening by heat or UV polymerization up to 600° C. at a ramp rate of 10° C. increase per minute, a mass loss of less than 4.0%, preferably less than 2.0%, e.g. less than 1.0% is observed at both 200° C. and 300° C. (typically a mass loss of less than 0.5% is observed at 200° C., or as in the example of FIG. 12, a mass loss of less than 0.2% at 200° C. is observed). At 300° C., a mass loss of less than 1% is observed in the example of FIG. 12, or more particularly less than 0.6%. Similar results can be observed by simply heating the polymerized material for 1 hour at 200° C., or at 300° C. Results of less than 1% mass loss by heating the polymerized deposited material at 375° C. or more for at least 1 hour are possible. As can be seen in FIG. 12, even at temperatures of greater than 500° C., a mass loss of 5% or less is observed. Such a thermally stable material is desirable, particularly one as disclosed herein that can be deposited at low temperatures (e.g. less than 175° C., preferably less than 150° C., or less than 130° C. at e.g. 30 min curing/baking time), or that can be polymerized by UV light.

The foregoing is illustrative of example embodiments and is not to be construed as limiting thereof. Although a few example embodiments have been described, those skilled in the art will readily appreciate that many modifications are possible in example embodiments without materially departing from the novel teachings and advantages. Accordingly, all such modifications are intended to be included within the scope of this invention as defined in the claims. Therefore, it is to be understood that the foregoing is illustrative of various example embodiments and is not to be construed as limited to the specific embodiments disclosed, and that modifications to the disclosed embodiments, as well as other embodiments, are intended to be included within the scope of the appended claims.

INDUSTRIAL APPLICABILITY

The above discussed compositions have a number of interesting applications. They can, for example, be used as adhesives or encapsulants in electronics or optoelectronics packaging, LED and OLED front and back end processing, 3D, photovoltaic and display metallization, in place of soldering e.g. solder bumps in semiconductor packaging, printed electronics, OLED low work function cathode ink, ITO replacement ink, metal mesh and other electrodes, high resolution photovoltaic paste, LMO cathode paste, photovoltaics, power electronics and EMI, touch sensor and other displays, heat or UV curable encapsulants or dielectrics.

What is claimed is:

1. An electrode comprising:
a supporting substrate;
a siloxane polymer directly on the supporting substrate;
a first group of particles coated by or mixed within the siloxane polymer and having an average particle size of less than 1 micron;
wherein the electrode is optically transmissive to visible light and transmits at least 75% of the light incident thereon;
wherein the electrode is electrically conductive and has a sheet resistance of 200 Ω/sq or less;
wherein the first group of particles are nanowires; and
wherein the siloxane polymer forms conductive bands spaced apart on the supporting substrate perpendicular to a surface of the supporting substrate.

2. The electrode of claim 1, further comprising a second group of particles that is different from the first group of particles, the second group of particles has an average particle size different from the first group of particles.

3. The electrode of claim 2, wherein the first group of particles are nanowires having an average particle width of less than 100 nm, and the second group of particles are nanoparticles having an average particle size of less than 100 nm.

4. The electrode of claim 2, wherein the second group of particles are graphene, indium tin oxide, silica, hollow silica $ZrO_2$, ZrO, $TiO_2$, $Ta_2O_5$, antimony tin oxide or $SnO_2$.

5. The electrode of claim 1, having substantially no —OH groups in the siloxane polymer.

6. The electrode of claim 1, which transmits at least 80% of the visible light incident thereon.

7. The electrode of claim 1, wherein the surface area ratio of the substrate covered by the particles as compared to the surface area covered by the siloxane polymer in the absence of particles, is 1:10 or less.

8. The electrode of claim 1, which is part of a display, part of a touch screen display, part of a photovoltaic device, part of an OLED device, or part of an LED lamp.

9. The electrode of claim 1, wherein the refractive index of the siloxane polymer layer is substantially the same as the refractive index of the substrate.

10. The electrode of claim 1, wherein the siloxane polymer is polymerized from at least a first compound, a second compound, and a third compound;
wherein the first compound is diphenylsilanediol, dimethylsilanediol, di-isopropylsilanediol, di-n-propylsilanediol, di-n-butylsilanediol, di-t-butylsilanediol, di-isobutylsilanediol, phenylmethylsilanediol or dicyclohexylsilanediol;
wherein the second compound is 2-(3,4-epoxycyclohexyl)ethyltrimethoxysilane, 2-(3,4-epoxycyclohexyl)ethyltriethoxysilane, 3-(trimethoxysilyl)propylmethacrylate, 3-(trimethoxy-silyl)propylacrylate, (3-glycidyloxypropyl)trimethoxysilane, 3-glycidoxypropyl-triethoxysilane, 3-methacryloxypropyltrimethoxysilane, 3-acryloxypropyltrimethoxysilane, 3-(3-ethyl-3-oxetanylmethoxy)propyltriethoxysilane, 3-(3-Methyl-3-oxetanylmethoxy)propyltriethoxysilane, 3-(3-ethyl-3-oxetanylmethoxy)propyltrimethoxysilane or 3-(3-methyl-3-oxetanylmethoxy)propyltrimethoxysilane; and
wherein the third compound is tetramethoxysilane, phenylmethyldimethoxysilane, trimethylmethoxysilane, dimethyldimethoxysilanesilane, vinyltrimethoxysilane, allyltrimethoxysilane, methyltrimethoxysilane, methyltriethoxysilane, methyl tripropoxysilane, propylethyltrimethoxysilane, ethyltriethoxysilane, vinyltrimethoxysilane or vinyltriethoxysilane.

* * * * *